(12) United States Patent
Lee et al.

(10) Patent No.: US 12,642,134 B2
(45) Date of Patent: May 26, 2026

(54) BONDING APPARATUS AND BONDING METHOD USING THE SAME

(71) Applicant: Samsung Display Co., Ltd., Yongin-si (KR)

(72) Inventors: Sangduk Lee, Yongin-si (KR); Chan-Jae Park, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 720 days.

(21) Appl. No.: 17/880,056

(22) Filed: Aug. 3, 2022

(65) Prior Publication Data

US 2023/0057934 A1 Feb. 23, 2023

(30) Foreign Application Priority Data

Aug. 17, 2021 (KR) ........................ 10-2021-0107886

(51) Int. Cl.
B23K 20/10 (2006.01)
H10W 90/00 (2026.01)
(Continued)

(52) U.S. Cl.
CPC .............. *H10W 90/00* (2026.01); *B23K 20/10* (2013.01); *B23K 20/106* (2013.01);
(Continued)

(58) Field of Classification Search
CPC ......... H01L 24/75; H01L 24/73; H01L 24/81; H01L 24/83; H01L 24/92; H01L 25/0657; H01L 25/18; H01L 25/50; H01L 24/16; H01L 24/32; H01L 2224/16148; H01L 2224/32145; H01L 2224/73104; H01L 2224/7517; H01L 2224/75252; H01L 2224/75318; H01L 2224/7532; H01L 2224/75353; H01L 2224/81206; H01L 2224/81207; H01L 2224/8183;
(Continued)

(56) References Cited

U.S. PATENT DOCUMENTS 3,737,361 A * 6/1973 Obeda ............... B29C 66/86521
228/1.1
3,962,007 A * 6/1976 Heimberger .......... B29C 65/086
156/219
(Continued)

FOREIGN PATENT DOCUMENTS

CA 2304995 A1 * 10/2000 ....... B29C 66/83511
CN 107106353 A * 8/2017 ............. A61F 13/15
(Continued)

OTHER PUBLICATIONS

Annettle O'Brien, Editor, American Welding Society, Welding Handbook—9 Edition, vol. 3, 2007, 14 Pages.

*Primary Examiner* — Kiley S Stoner
(74) *Attorney, Agent, or Firm* — CANTOR COLBURN LLP

(57) ABSTRACT

A bonding apparatus includes an ultrasonic oscillator which generates ultrasonic vibration, a stage disposed under the ultrasonic oscillator, and an embossed sheet disposed between the ultrasonic oscillator and the stage. The embossed sheet includes a body and a plurality of protrusions protruding downward from a lower surface of the body which faces the stage.

20 Claims, 16 Drawing Sheets

(51) Int. Cl.

| | |
|---|---|
| *H10W 72/00* | (2026.01) |
| *H10W 74/15* | (2026.01) |
| *H10W 99/00* | (2026.01) |

(52) U.S. Cl.
CPC *H10W 72/07131* (2026.01); *H10W 72/07141* (2026.01); *H10W 72/07233* (2026.01); *H10W 72/07236* (2026.01); *H10W 72/07333* (2026.01); *H10W 72/07338* (2026.01); *H10W 74/15* (2026.01); *H10W 90/722* (2026.01); *H10W 90/732* (2026.01); *H10W 99/00* (2026.01)

(58) Field of Classification Search
CPC . H01L 2224/83206; H01L 2224/83207; H01L 2224/83862; H01L 2224/9211; H01L 2225/06513; H01L 2224/75305; H01L 2224/75317; H01L 2224/75343; H01L 2224/80205; H01L 2224/81002; H01L 2224/81007; H01L 2224/83192; H01L 2224/83205; H01L 24/80; B23K 20/10–106; B29C 65/08
USPC .......... 228/110.1, 1.1; 156/73.1–73.6, 156/580.1–580.2
See application file for complete search history.

(56) References Cited

U.S. PATENT DOCUMENTS

| | | | | |
|---|---|---|---|---|
| 3,982,988 | A * | 9/1976 | Heimberger | A44B 19/40 156/219 |
| 4,080,229 | A * | 3/1978 | Williams | B29C 66/00441 228/110.1 |
| 4,230,757 | A * | 10/1980 | Toner | B29C 66/472 428/167 |
| 4,361,609 | A | 11/1982 | Gerlach et al. | |
| 4,798,639 | A * | 1/1989 | Yamaguchi | B29C 65/7841 156/580.2 |
| 4,999,067 | A * | 3/1991 | Erb | A44B 18/0073 264/177.17 |
| 5,511,719 | A | 4/1996 | Miyake et al. | |
| 6,200,399 | B1 * | 3/2001 | Thielman | B29C 59/046 156/580.2 |
| 10,864,597 | B2 | 12/2020 | Yoshida et al. | |
| 2003/0121588 | A1 * | 7/2003 | Pargass | A61F 13/15731 156/73.1 |
| 2008/0009100 | A1 * | 1/2008 | Davison | H01L 21/4867 438/120 |
| 2009/0008022 | A1 * | 1/2009 | Kiessling | B41F 16/00 156/73.1 |
| 2016/0075167 | A1 * | 3/2016 | Cruikshank | B32B 38/0012 156/308.2 |
| 2016/0368640 | A1 * | 12/2016 | Hull | B29C 66/9516 |
| 2019/0198476 | A1 * | 6/2019 | Kim | H01L 24/75 |
| 2019/0348487 | A1 * | 11/2019 | Kim | H10K 59/131 |
| 2022/0048129 | A1 * | 2/2022 | Böhm | B23K 26/244 |
| 2022/0063848 | A1 * | 3/2022 | Gres | B29C 66/72328 |
| 2022/0415845 | A1 * | 12/2022 | Dzhangirov | H01L 21/67 |
| 2023/0057934 | A1 * | 2/2023 | Lee | H01L 25/50 |

FOREIGN PATENT DOCUMENTS

| | | | | | |
|---|---|---|---|---|---|
| CN | 113284870 | A | * | 8/2021 | H01L 24/11 |
| DE | 112014003148 | B4 | * | 11/2020 | B23K 20/106 |
| EP | 1011132 | A2 | * | 6/2000 | B23K 20/10 |
| EP | 1205970 | A2 | * | 5/2002 | H01L 21/563 |
| EP | 3517278 | A1 | * | 7/2019 | A61F 13/15699 |
| JP | 63119552 | A | * | 5/1988 | B23K 20/10 |
| JP | 01077518 | A | * | 3/1989 | B29C 65/02 |
| JP | S6477518 | A | * | 3/1989 | |
| JP | H06342976 | A | | 12/1994 | |
| JP | H08146451 | A | | 6/1996 | |
| JP | 2006196526 | A | * | 7/2006 | |
| JP | 4893814 | B2 | | 1/2012 | |
| JP | 5018760 | B2 | | 9/2012 | |
| JP | 2019005776 | A | * | 1/2019 | B23K 20/106 |
| JP | 2020001062 | A | * | 1/2020 | B06B 3/02 |
| KR | 20120024804 | A | | 3/2012 | |
| WO | WO-9614202 | A2 | * | 5/1996 | B29C 66/8223 |
| WO | WO-9931704 | A1 | * | 6/1999 | B23K 20/10 |
| WO | WO-0027626 | A1 | * | 5/2000 | D04H 5/10 |
| WO | WO-2014024802 | A1 | * | 2/2014 | B23K 20/002 |
| WO | WO-2017169340 | A1 | * | 10/2017 | A61F 13/15 |
| WO | WO-2020120726 | A1 | * | 6/2020 | B23K 20/10 |
| WO | WO-2021020032 | A1 | * | 2/2021 | B23K 20/10 |

* cited by examiner

BNA

Ultrasonic Vibration

Heat & Pressure

HON

TH2
TH1

BD
PRT
EMS

DDV
BP-PD
PTL
P-PD

DP
AL1
PPF

STG2
STG1
STG

V     V'

RES

DR3

DR1   DR2

BNA

HON

BD
PRT  } EMS
RIN

DDV

BP-PD
PTL     P-PD

DP
AL1
PPF

STG2
} STG
STG1

V                                              V'

RES

DR3

DR1 ← ⊗
DR2

BONDING APPARATUS AND BONDING METHOD USING THE SAME

This application claims priority to Korean Patent Application No. 10-2021-0107886, filed on Aug. 17, 2021, and all the benefits accruing therefrom under 35 U.S.C. § 119, the content of which in its entirety is herein incorporated by reference.

BACKGROUND

1. Field

Embodiments of the disclosure described herein relate to a bonding apparatus and a bonding method using the bonding apparatus.

2. Description of the Related Art

In general, a display device includes a display panel including a plurality of pixels and a driver integrated circuit ("IC") for driving the pixels. The driver IC may be disposed on the display panel and may be mounted on an upper surface of the display panel.

In such a display device, the driver IC may be bonded to the display panel by a bonding apparatus. In a display device, for example, panel pads may be disposed on a display panel, and bump pads are disposed on a lower portion of the driver IC. The panel pads may be connected to the pixels, and the bump pads may be connected to circuits in the driver IC. The driver IC may be disposed on the display panel, and therefore the bump pads may be disposed on the panel pads. The bump pads may be brought into contact with the panel pads and be electrically connected to the panel pads by the bonding apparatus. As a result, the driver IC may be connected to the display panel.

The bump pads are connected to the panel pads by various methods. For example, the bump pads and the panel pads may be electrically connected with each other by an anisotropic conductive film. Alternatively, the bump pads and the panel pads may be connected with each other by an ultrasonic bonding method without using the anisotropic conductive film.

SUMMARY

Embodiments of the disclosure provide a bonding apparatus for improving the flatness of an ultrasonic oscillator generating ultrasonic vibration and preventing damage to a data driver by the ultrasonic oscillator, and a bonding method using the bonding apparatus.

According to an embodiment, a bonding apparatus includes an ultrasonic oscillator which generates ultrasonic vibration, a stage disposed under the ultrasonic oscillator, and an embossed sheet disposed between the ultrasonic oscillator and the stage. In such an embodiment, the embossed sheet includes a body and a plurality of protrusions protruding downward from a lower surface of the body which faces the stage.

According to an embodiment, a bonding method includes disposing a data driver on a display panel disposed on a stage, disposing an embossed sheet over the data driver and an ultrasonic oscillator over the embossed sheet, bringing the ultrasonic oscillator into contact with the data driver through the embossed sheet by moving the ultrasonic oscillator downward to the data driver, and bonding the data driver to the display panel by generating ultrasonic vibration and heat from the ultrasonic oscillator. In such an embodiment, the embossed sheet includes a body and a plurality of protrusions protruding downward from a lower surface of the body which faces the stage.

BRIEF DESCRIPTION OF THE DRAWINGS

The above and other features of the disclosure will become apparent by describing in detail embodiments thereof with reference to the accompanying drawings.

DETAILED DESCRIPTION

Figure 1:
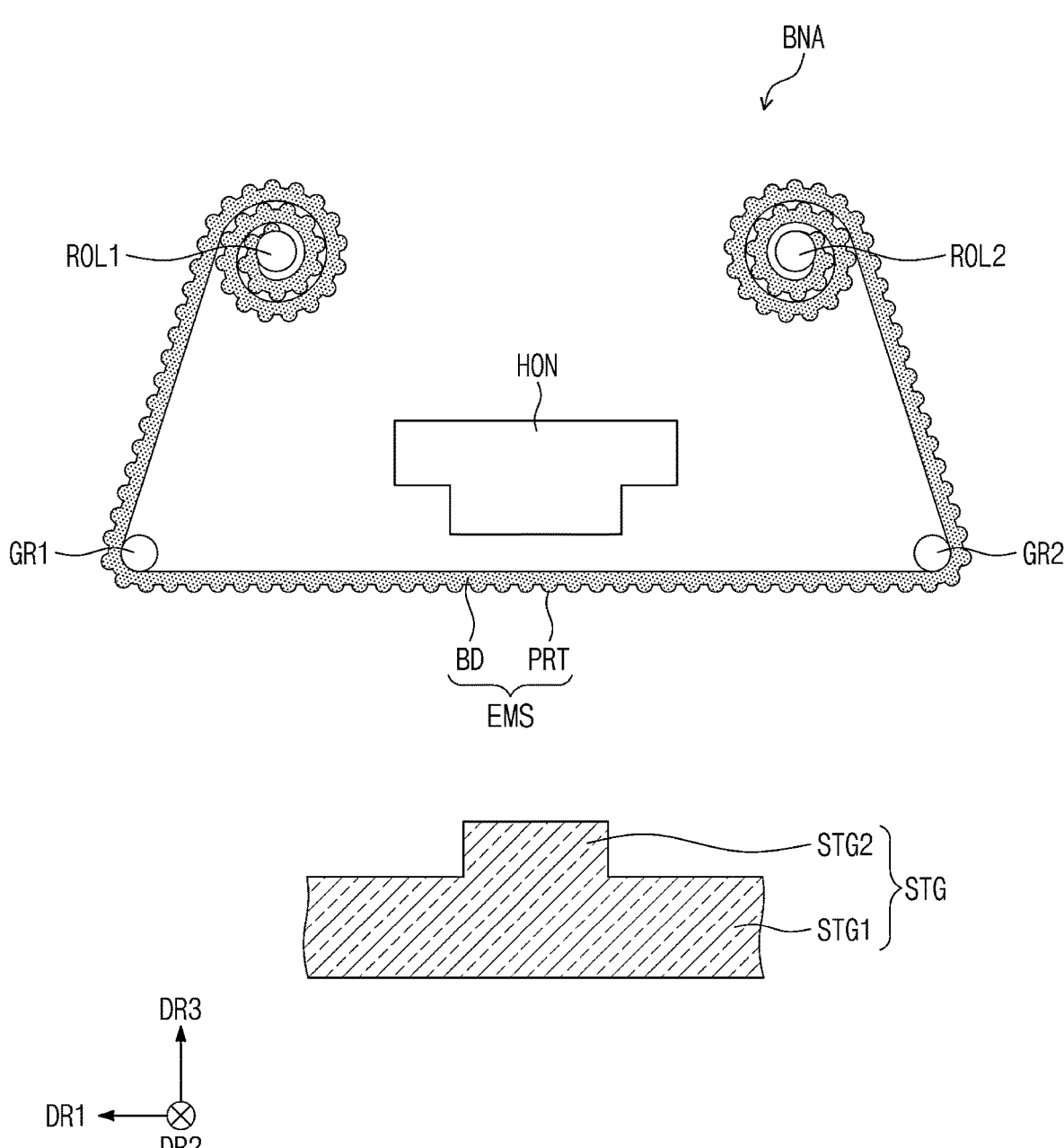
FIG. 1 is a view illustrating a bonding apparatus according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, when it is mentioned that a component (or, an area, a layer, a part, etc.) is referred to as being "on", "connected to" or "coupled to" another component, this means that the component may be directly on, connected to, or coupled to the other component or a third component may be therebetween. In contrast, when an element is referred to as being "directly on" another element, there are no intervening elements present.

Like reference numerals refer to like elements throughout. Additionally, in the drawings, the thicknesses, proportions, and dimensions of components are exaggerated for effective description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes all of one or more combinations defined by related components.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In addition, terms such as "below", "under", "above", and "over" are used to describe a relationship of components illustrated in the drawings. The terms are relative concepts and are described based on directions illustrated in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described with reference to the accompanying drawings.

FIG. 1 is a view illustrating a bonding apparatus according to an embodiment of the disclosure.

Referring to FIG. 1, an embodiment of the bonding apparatus BNA may be defined as an ultrasonic bonding apparatus that performs a bonding operation using ultrasonic waves. The bonding apparatus BNA may include a stage STG, an ultrasonic oscillator HON, an embossed sheet EMS, a first guide roller GR1, a second guide roller GR2, a first roller ROL1, and a second roller ROL2.

The stage STG may be disposed under the ultrasonic oscillator HON. The stage STG may include a first stage STG1 and a second stage STG2. The first stage STG1 may include a surface on a plane defined by a first direction DR1 and a second direction DR2 crossing the first direction DR1.

Hereinafter, a direction substantially vertically crossing the plane defined by the first and second directions DR1 and DR2 is defined as a third direction DR3. As used herein, the expression "when viewed on the plane" may mean that when viewed in a plan view in the third direction DR3.

The second stage STG2 may protrude from the first stage STG1 in the third direction DR3. Hereinafter, an upward direction and a downward direction may be relative directions defined with respect to the third direction DR3. The second stage STG2 may protrude upward from an upper surface of the first stage STG1.

The ultrasonic oscillator HON may be disposed over the stage STG. The ultrasonic oscillator HON may be disposed to face the second stage STG2 protruding upward from the first stage STG1. The ultrasonic oscillator HON may generate vibration and heat. The ultrasonic oscillator HON may generate ultrasonic vibration oscillating in the first direction DR1.

The embossed sheet EMS may be disposed over the stage STG. The embossed sheet EMS may be disposed between the ultrasonic oscillator HON and the stage STG. The embossed sheet EMS may extend in the first direction DR1. The embossed sheet EMS may include a metal.

The embossed sheet EMS may include a body BD and a plurality of protrusions PRT protruding from the body BD. The protrusions PRT may protrude toward the stage STG. In an embodiment, for example, the protrusions PRT may protrude downward from a lower surface of the body BD that faces the stage STG. The protrusions PRT may each have a curved surface convex downward.

The first guide roller GR1 and the second guide roller GR2 may be spaced apart from each other in the first direction DR1. The first and second guide rollers GR1 and GR2 may be disposed over the stage STG. The ultrasonic oscillator HON, when viewed on the plane, may be disposed between the first guide roller GR1 and the second guide roller GR2.

The first and second guide rollers GR1 and GR2 may have a circular shape when viewed in the second direction DR2. The first and second guide rollers GR1 and GR2 may rotate about rotation axes parallel to the second direction DR2.

The first roller ROL1 and the second roller ROL2 may be spaced apart from each other in the first direction DR1. The first and second rollers ROL1 and ROL2 may be disposed over the stage STG. The first and second rollers ROL1 and ROL2 may be disposed over the first and second guide rollers GR1 and GR2, respectively. The ultrasonic oscillator HON, when viewed on the plane, may be disposed between the first roller ROL1 and the second roller ROL2.

The first and second rollers ROL1 and ROL2 may have a circular shape when viewed in the second direction DR2. The first and second rollers ROL1 and ROL2 may rotate about rotation axes parallel to the second direction DR2.

The embossed sheet EMS may be rolled around the first roller ROL1 and the second roller ROL2. The embossed sheet EMS may be guided by the first guide roller GR1 and the second guide roller GR2 and may be disposed under the ultrasonic oscillator HON.

One end of the embossed sheet EMS may be connected to the first roller ROL1, and a portion of the embossed sheet EMS adjacent to the one end may be rolled around the first roller ROLL The embossed sheet EMS may extend from the first roller ROL1 toward the first guide roller GR1. The embossed sheet EMS may pass over the first guide roller GR1 while making contact with a lower left curved surface of the first guide roller GR1 and may extend in the first direction DR1.

In an embodiment, the embossed sheet EMS may pass over the first guide roller GR1 and may extend rightward with respect to the first direction DR1. The embossed sheet EMS may extend rightward from the first guide roller GR1 toward the second guide roller GR2.

The embossed sheet EMS may extend from the first guide roller GR1 toward the second guide roller GR2 through between the ultrasonic oscillator HON and the stage STG. The embossed sheet EMS may extend toward the second roller ROL2 while making contact with a lower right curved surface of the second guide roller GR2. An opposite end of the embossed sheet EMS may be connected to the second roller ROL2, and a portion of the embossed sheet EMS adjacent to the opposite end may be rolled around the second roller ROL2.

A display panel may be disposed on the stage STG. A data driver may be disposed on the display panel. The embossed sheet EMS and the ultrasonic oscillator HON may be disposed over the data driver. The data driver may be bonded to the display panel by the ultrasonic oscillator HON and the embossed sheet EMS. This operation will be described below in detail.

Figure 2A:
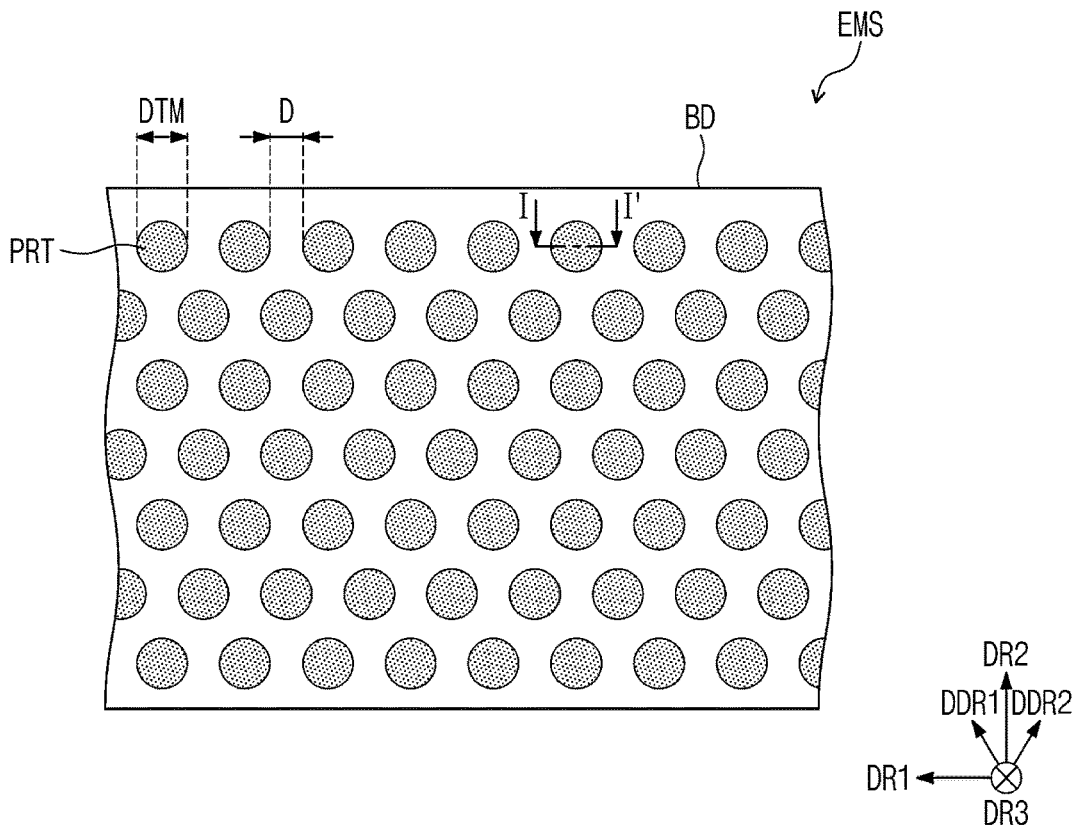
FIG. 2A is a view illustrating a planar structure of an embossed sheet illustrated in FIG. 1.
Figure 2B:
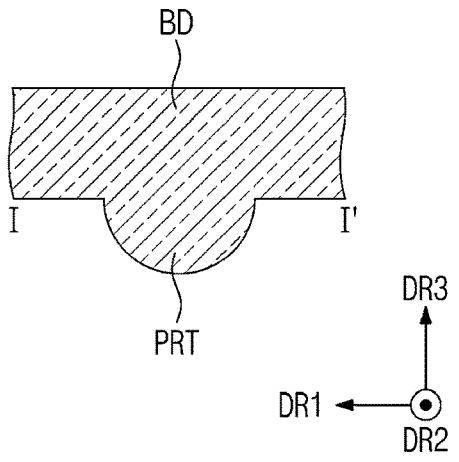
FIG. 2B is a sectional view taken along line I-I' illustrated in FIG. 2A.

FIG. 2A is a view illustrating a planar structure of the embossed sheet illustrated in FIG. 1. FIG. 2B is a sectional view taken along line I-I' illustrated in FIG. 2A.

Referring to FIGS. 2A and 2B, the protrusions PRT of the embossed sheet EMS may protrude from the body BD in the third direction DR3. In an embodiment, the protrusions PRT may protrude downward with respect to the third direction DR3. The protrusions PRT may have a dot shape. The protrusions PRT, when viewed on the plane, may have a circular shape. The protrusions PRT may be arranged in a lattice form. In an embodiment, for example, the protrusions PRT may be arranged in a first diagonal direction DDR1 and a second diagonal direction DDR2 crossing the first diagonal direction DDR1.

The first and second diagonal directions DDR1 and DDR2 may be defined as directions crossing the first and second directions DR1 and DR2 on the plane defined by the first and second directions DR1 and DR2.

The protrusions PRT may be densely disposed on the body BD. In an embodiment, for example, the gap D between the $k^{th}$ protrusion PRT and the $(k+1)^{th}$ protrusion PRT may be smaller than the diameter DTM of each of the protrusions PRT. Here, "k" is a natural number. The gap D may be defined as the distance with respect to the first direction DR1, the first diagonal direction DDR1, or the second diagonal direction DDR2.

Figure 3A:
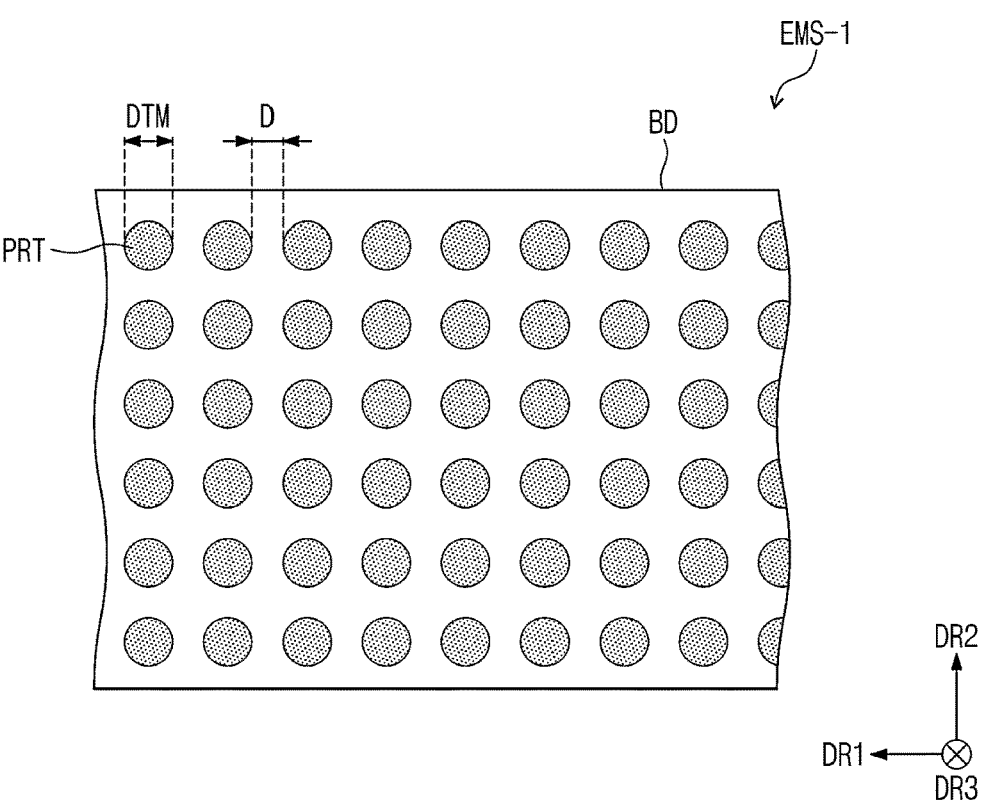
FIGS. 3A and 3B are views illustrating various planar structures of the embossed sheet illustrated in FIG. 1.
Figure 3B:
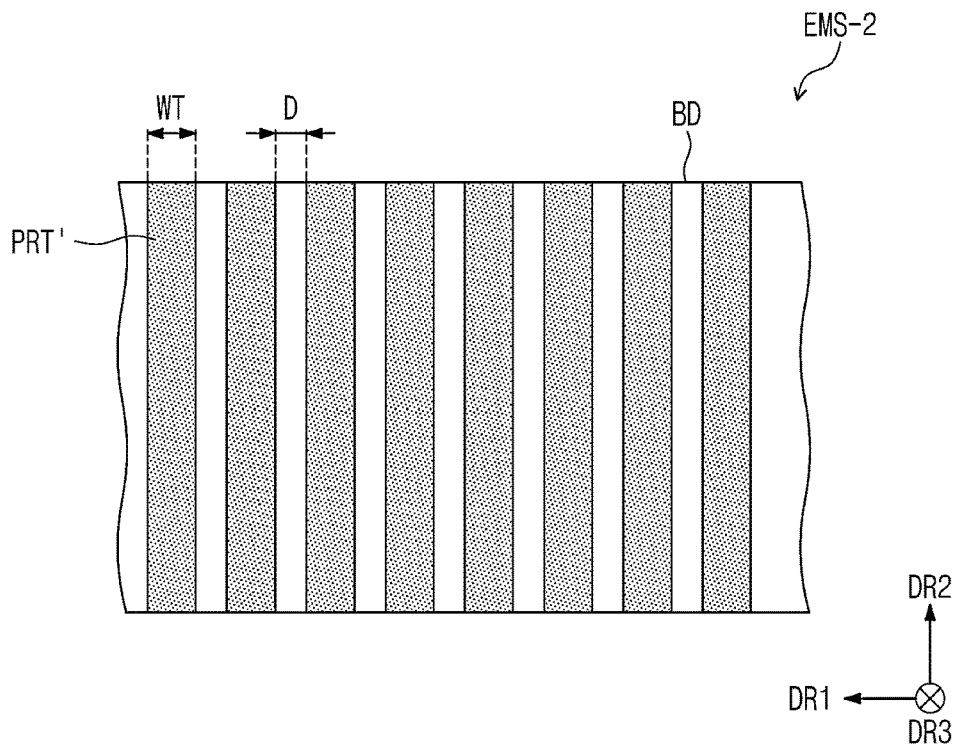

FIGS. 3A and 3B are views illustrating various planar structures of the embossed sheet illustrated in FIG. 1.

Referring to FIG. 3A, in an embodiment, protrusions PRT of an embossed sheet EMS-1 may protrude from a body BD in the third direction DR3 and may have a circular dot shape. Similarly to the structure of the embodiment illustrated in FIG. 2B, an embodiment of the protrusions PRT illustrated in FIG. 3A may protrude downward with respect to the third direction DR3. The protrusions PRT may be arranged in a lattice form. In an embodiment, for example, the protrusions PRT may be arranged in the first direction DR1 and the second direction DR2.

The protrusions PRT may be densely disposed on the body BD. In an embodiment, for example, the gap D between the $k^{th}$ protrusion PRT and the $(k+1)^{th}$ protrusion PRT may be smaller than the diameter DTM of each of the protrusions PRT. The gap D may be defined as the distance with respect to the first direction DR1 or the second direction DR2.

Referring to FIG. 3B, in an alternative embodiment, protrusions PRT' of an embossed sheet EMS-2 may protrude from a body BD in the third direction DR3. Similarly to the structure of the embodiment illustrated in FIG. 2B, an embodiment of the protrusions PRT' illustrated in FIG. 3B may protrude downward with respect to the third direction DR3. The protrusions PRT' may extend in the second direction DR2 crossing the first direction DR1 that is the oscillating direction of the ultrasonic vibration described above. The protrusions PRT' may be arranged to be spaced apart from each other at a constant interval in the first direction DR1.

The protrusions PRT' may be densely disposed on the body BD. In an embodiment, for example, the gap D between the $k^{th}$ protrusion PRT' and the $(k+1)^{th}$ protrusion PRT' may be smaller than the width WT of each of the protrusions PRT'. The width WT may be substantially the same as the diameter DTM of the embodiments shown in FIGS. 2A and 3A.

Figure 4:
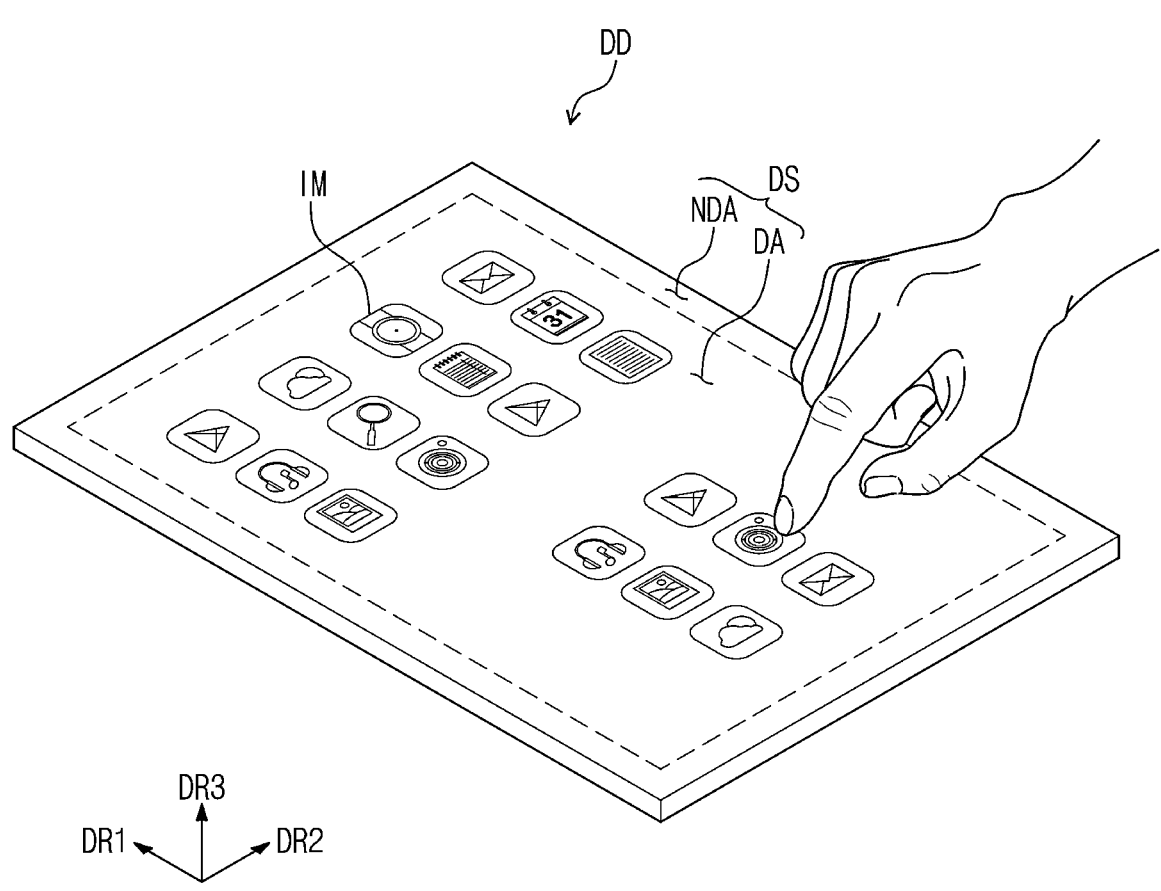
FIG. 4 is a perspective view of a display device including a display panel manufactured by using the bonding apparatus illustrated in FIG. 1.

FIG. 4 is a perspective view of a display device including a display panel manufactured by using the bonding apparatus illustrated in FIG. 1.

Referring to FIG. 4, an embodiment of the display device DD may have a rectangular shape with long sides extending in the first direction DR1 and short sides extending in the second direction DR2 crossing the first direction DR1. Alternatively, without being limited thereto, the display device DD may have various shapes such as a circular shape, a polygonal shape, and the like.

Hereinafter, the direction substantially vertically crossing the plane defined by the first direction DR1 and the second direction DR2 is defined as the third direction DR3. As used herein, the expression "when viewed on the plane" may mean that when viewed in the third direction DR3.

The upper surface of the display device DD may be defined as a display surface DS and may have a plane defined by the first direction DR1 and the second direction DR2. Images IM generated by the display device DD may be provided to a user through the display surface DS.

The display surface DS may include a display area DA and a non-display area NDA around the display area DA. The display area DA may display an image IM, and the non-display area NDA may not display an image IM. The non-display area NDA may surround the display area DA and may define a border of the display device DD that is printed in a predetermined color.

The display device DD may be used in large electronic devices such as a television, a monitor, and outdoor signage. In addition, the display device DD may be used in small and medium-sized electronic devices such as a personal computer, a notebook computer, a personal digital terminal, a car navigation system, a game machine, a smart phone, a tablet computer, and a camera. However, these devices are merely illustrative, and the display device DD may also be used in other electronic devices without departing from the teachings therein.

Figure 5:
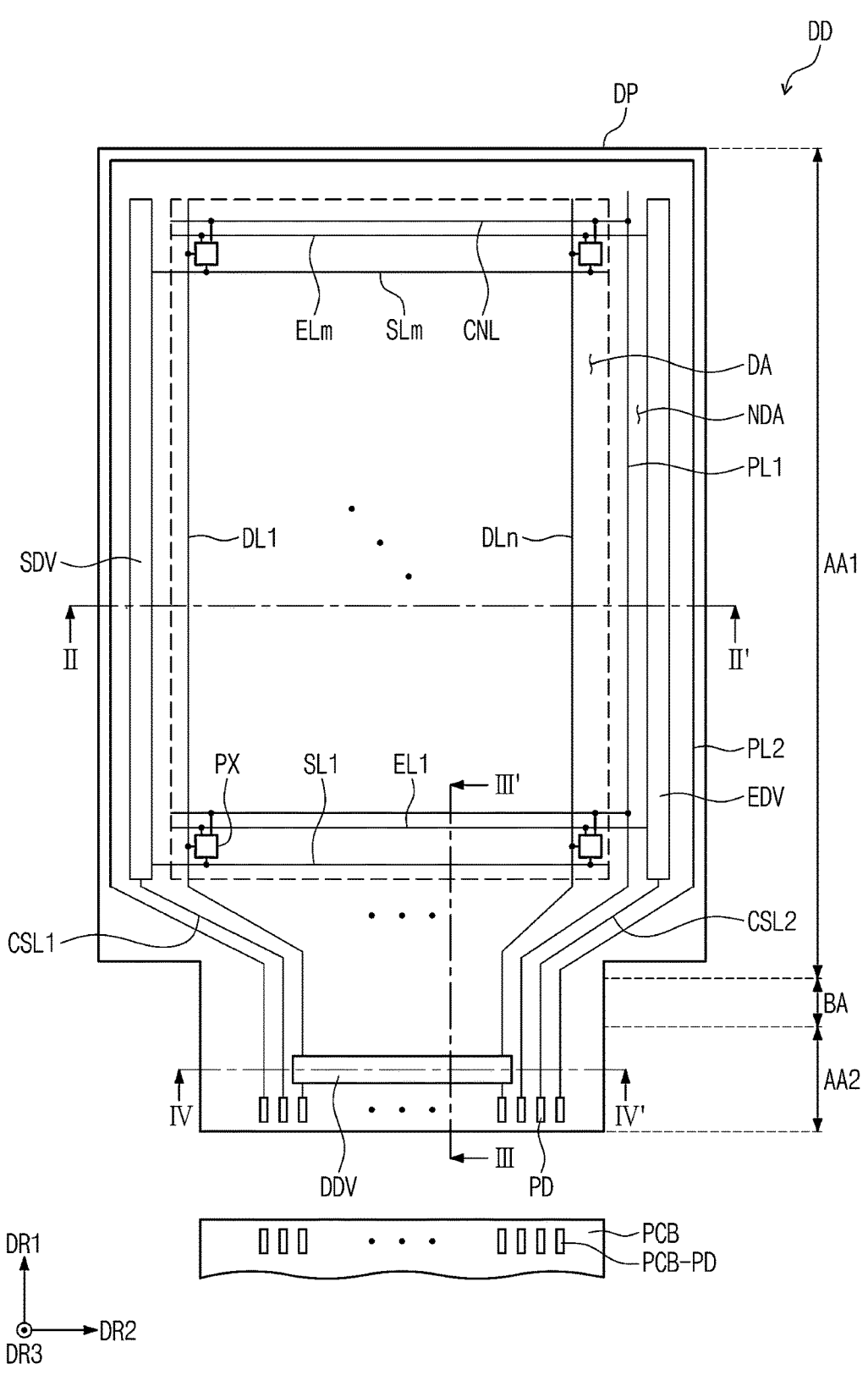
FIG. 5 is a plan view of the display device illustrated in FIG. 4.

FIG. 5 is a plan view of the display device illustrated in FIG. 4.

Referring to FIG. 5, an embodiment of the display device DD may include a display panel DP, a scan driver SDV, a data driver DDV, and an emission driver EDV.

The display panel DP may be a flexible display panel. In an embodiment, for example, the display panel DP may include a plurality of electronic elements disposed on a flexible substrate. The display panel DP may extend longer in the first direction DR1 than in the second direction DR2. The display panel DP may have a plane defined by the first and second directions DR1 and DR2.

The display panel DP may include a first area AA1, a second area AA2, and a bending area BA between the first area AA1 and the second area AA2. The bending area BA may extend in the second direction DR2, and the first area AA1, the bending area BA, and the second area AA2 may be arranged in the first direction DR1.

The first area AA1 may have long sides that extend in the first direction DR1 and face away from each other in the second direction DR2. The lengths of the bending area BA and the second area AA2 in the second direction DR2 may be smaller than the distance between the long sides of the first area AA1.

The first area AA1 may include a display area DA and a non-display area NDA around the display area DA. The non-display area NDA may surround the display area DA. The display area DA may be an area that displays an image, and the non-display area NDA may be an area that does not display an image. The second area AA2 and the bending area BA may be areas that do not display an image.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, a plurality of connecting lines CNL, and a plurality of pads PD. Here, "m" and "n" are natural numbers. The pixels PX may be disposed on the display area DA and may be connected to the scan lines SL1 to SLm, the data lines DL1 to DLn, and the emission lines EL1 to ELm.

The scan driver SDV and the emission driver EDV may be disposed on the non-display area NDA. The scan driver SDV and the emission driver EDV may be disposed on the non-display areas NDA that are adjacent to the long sides of the first area AA1, respectively. The data driver DDV may be disposed on the second area AA2. The data driver DDV may be manufactured in the form of an integrated circuit chip and may be mounted on the second area AA2.

The scan lines SL1 to SLm may extend in the second direction DR2 and may be connected to the scan driver SDV. The data lines DL1 to DLn may extend in the first direction DR1 and may be connected to the data driver DDV via the bending area BA. The emission lines EL1 to ELm may extend in the second direction DR2 and may be connected to the emission driver EDV.

The first power line PL1 may extend in the first direction DR1 and may be disposed on the non-display area NDA. The first power line PL1 may be disposed between the display area DA and the emission driver EDV. Alternatively, without being limited thereto, the first power line PL1 may be disposed between the display area DA and the scan driver SDV.

The first power line PL1 may extend to the second area AA2 via the bending area BA. The first power line PL1 may extend toward a lower end of the second area AA2 when viewed on the plane. The first power line PL1 may receive a first voltage.

The second power line PL2 may be disposed on the non-display areas NDA adjacent to the long sides of the first area AA1 and on the non-display area NDA facing the second area AA2 with the display area DA therebetween. The second power line PL2 may be disposed outward of the scan driver SDV and the emission driver EDV.

The second power line PL2 may extend to the second area AA2 via the bending area BA. The second power line PL2 may extend in the first direction DR1 with the data driver DDV therebetween on the second area AA2. The second power line PL2 may extend toward the lower end of the second area AA2 when viewed on the plane.

The second power line PL2 may receive a second voltage having a lower level than the first voltage. Although a connecting relationship is not illustrated in FIG. 5 for convenience of description, the second power line PL2 may extend to the display area DA and may be connected to the pixels PX, and the second voltage may be provided to the pixels PX through the second power line PL2.

The connecting lines CNL may extend in the second direction DR2 and may be arranged in the first direction DR1. The connecting lines CNL may be connected to the first power line PL1 and the pixels PX. The first voltage may be applied to the pixels PX through the first power line PL1 and the connecting lines CNL connected with each other.

The first control line CSL1 may be connected to the scan driver SDV and may extend toward the lower end of the second area AA2 via the bending area BA. The second control line CSL2 may be connected to the emission driver EDV and may extend toward the lower end of the second area AA2 via the bending area BA. The data driver DDV may be disposed between the first control line CSL1 and the second control line CSL2.

The pads PD may be disposed adjacent to the lower end of the second area AA2 when viewed on the plane. The data driver DDV, the first power line PL1, the second power line PL2, the first control line CSL1, and the second control line CSL2 may be connected to the pads PD.

The data lines DL1 to DLn may be connected to the corresponding pads PD through the data driver DDV. In an embodiment, for example, the data lines DL1 to DLn may be connected to the data driver DDV, and the data driver DDV may be connected to the pads PD corresponding to the data lines DL1 to DLn.

The data driver DDV may be defined as a driver integrated circuit ("IC"). The data driver DDV may be connected to the display panel DP through the bonding apparatus BNA illustrated in FIG. 1. This bonding operation will be described below in detail.

The display device DD may include a printed circuit board PCB connected to the pads PD. Connecting pads PCB-PD may be disposed on the printed circuit board PCB and may be connected to the pads PD.

A timing controller (not illustrated) and a voltage generator (not illustrated) may be disposed on the printed circuit board PCB. The timing controller and the voltage generator may be connected to the pads PD through the printed circuit board PCB.

The timing controller may control operations of the scan driver SDV, the data driver DDV, and the emission driver EDV. The timing controller may generate a scan control signal, a data control signal, and an emission control signal in response to control signals received from the outside. The voltage generator may generate the first voltage and the second voltage. The first voltage and the second voltage may be applied to the first power line PL1 and the second power line PL2, respectively.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside. The timing controller may convert the data format of the image signals to correspond to the specification of an interface with the data driver DDV and may provide the converted signals to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. Emission time of the pixels PX may be controlled by the emission signals.

Figure 6:
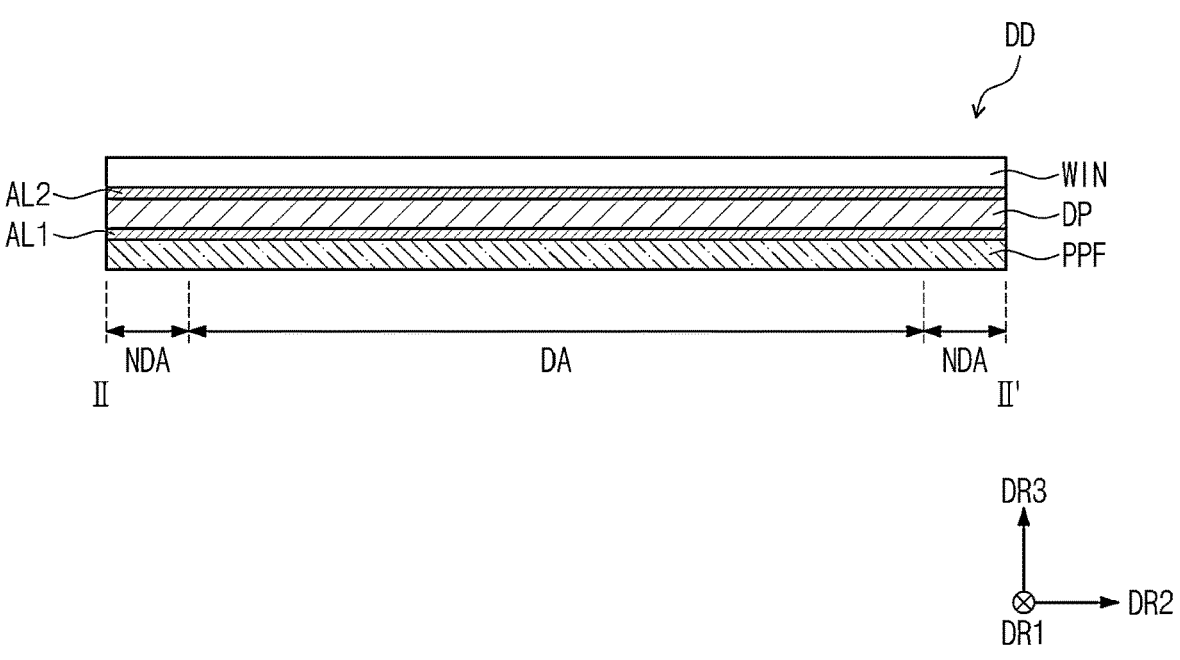
FIG. 6 is a sectional view taken along line II-IF illustrated in FIG. 5.

FIG. 6 is a sectional view taken along line II-IF illustrated in FIG. 5.

Referring to FIG. 6, an embodiment of the display device DD may include the display panel DP, a window WIN, a panel protection film PPF, and first and second adhesive layers AL1 and AL2.

The display panel DP may be a flexible display panel. In an embodiment, the display panel DP may be an emissive display panel, but is not particularly limited. In an embodiment, for example, the display panel DP may be an organic light emitting display panel or an inorganic light emitting display panel. An emissive layer of the organic light emitting display panel may include an organic light emitting material. An emissive layer of the inorganic light emitting display panel may include quantum dots, quantum rods, and the like.

The window WIN may be disposed over the display panel DP. The window WIN may protect the display panel DP from external scratches and shocks.

The panel protection film PPF may be disposed under the display panel DP. The panel protection film PPF may protect a lower portion of the display panel DP. The panel protection film PPF may include a flexible plastic material such as polyethylene terephthalate ("PET").

The first adhesive layer AL1 may be disposed between the display panel DP and the panel protection film PPF, and the display panel DP and the panel protection film PPF may be bonded to each other by the first adhesive layer AL1. The second adhesive layer AL2 may be disposed between the window WIN and the display panel DP, and the window WIN and the display panel DP may be bonded to each other by the second adhesive layer AL2.

Figure 7:
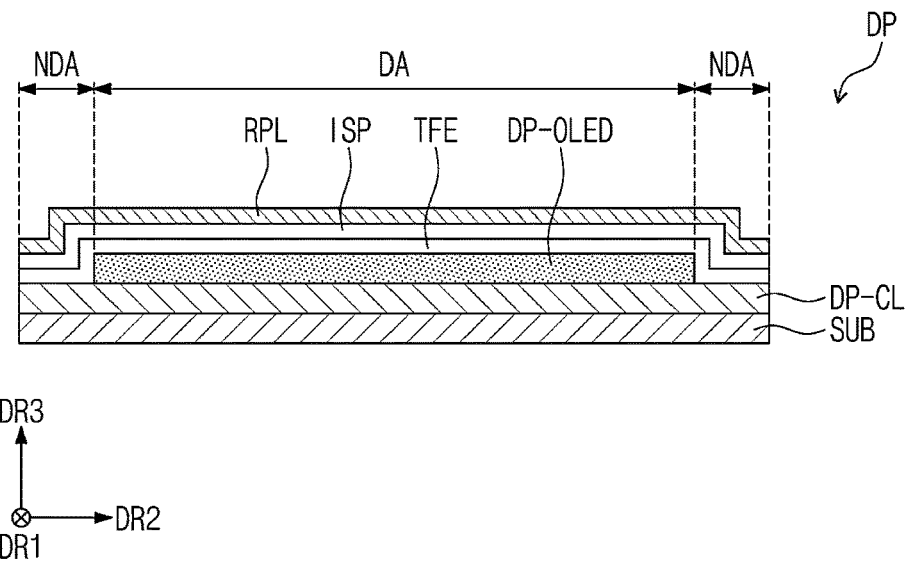
FIG. 7 is a sectional view of the display panel illustrated in FIG. 6.

FIG. 7 is a sectional view of the display panel illustrated in FIG. 6.

Referring to FIG. 7, an embodiment of the display panel DP may include a substrate SUB, a circuit element layer DP-CL disposed on the substrate SUB, a display element layer DP-OLED disposed on the circuit element layer DP-CL, a thin-film encapsulation layer TFE disposed on the display element layer DP-OLED, an input sensing part ISP disposed on the thin-film encapsulation layer TFE, and an anti-reflection layer RPL disposed on the input sensing part ISP.

The substrate SUB may include a display area DA and a non-display area NDA around the display area DA. The substrate SUB may include a flexible plastic material. In an embodiment, for example, the substrate SUB may include polyimide ("PI"). The display element layer DP-OLED may be disposed on the display area DA.

The plurality of pixels PX may be disposed in the circuit element layer DP-CL and the display element layer DP-OLED. Each of the pixels PX may include a transistor disposed in the circuit element layer DP-CL and a light emitting element disposed in the display element layer DP-OLED and connected to the transistor.

The thin-film encapsulation layer TFE may be disposed on the circuit element layer DP-CL to cover the display element layer DP-OLED. The thin-film encapsulation layer TFE may include an inorganic layer, an organic layer, and an inorganic layer sequentially stacked one above another. The inorganic layers may include an inorganic material and may protect the pixels PX from moisture/oxygen. The organic layer may include an organic material and may protect the pixels PX from foreign matter such as dust particles.

The input sensing part ISP may include a plurality of sensors (not illustrated) for sensing an external input. The sensors may sense the external input in a capacitive manner. The external input may include various forms of inputs such as a part of the user's body, light, heat, a pen, pressure, and the like.

The input sensing part ISP may be directly manufactured on the thin-film encapsulation layer TFE in a manufacturing process of the display panel DP. Alternatively, without being limited thereto, the input sensing part ISP may be manufactured as a panel separate from the display panel DP and may be attached to the display panel DP by an adhesive layer.

The anti-reflection layer RPL may be defined as a film for preventing reflection of external light. The anti-reflection layer RPL may be directly manufactured on the input sensing part ISP when the display panel DP is manufactured. The anti-reflection layer RPL may decrease the reflectivity of external light incident toward the display panel DP from above the display device DD.

When external light travelling toward the display panel DP is reflected from the display panel DP and provided back to the user, the user may visually recognize the external light as in a mirror. In an embodiment, the anti-reflection layer RPL may include a plurality of color filters that display same colors as the pixels PX of the display panel DP to prevent such a phenomenon. The external light may be filtered in the same colors as those of the pixels PX by the color filters. In such an embodiment, the external light may not be visible to the user.

Figure 8:
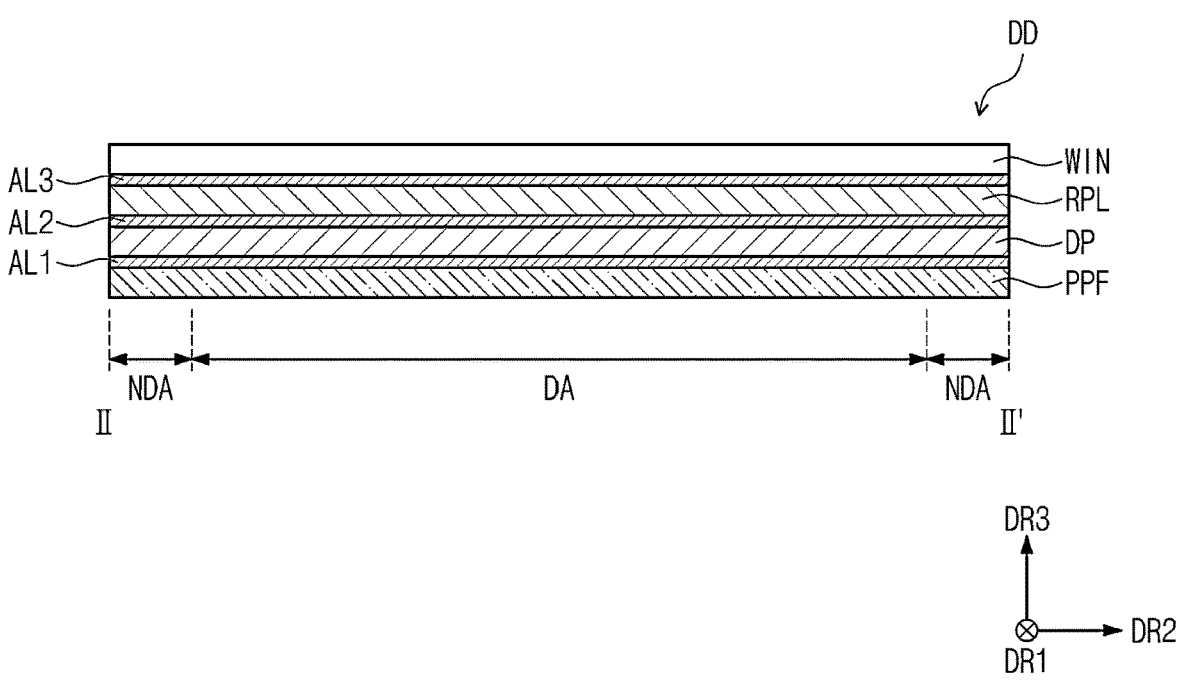
FIG. 8 is a sectional view of a display device according to an embodiment of the disclosure.

FIG. 8 is a sectional view of a display device according to an embodiment of the disclosure.

The sectional view of FIG. 8 corresponds to the sectional view of FIG. 6.

Referring to FIG. 8, an embodiment of the display device DD may include a display panel DP, an anti-reflection layer RPL, a window WIN, a panel protection film PPF, and first to third adhesive layers AL1, AL2, and AL3.

The anti-reflection layer RPL may be disposed over the display panel DP. In an embodiment, the anti-reflection layer RPL may be separately manufactured and may be attached to an upper surface of the display panel DP. In such an embodiment, to decrease the reflectivity of external light, the anti-reflection layer RPL may include a polarizer film that includes a phase retarder and/or a polarizer.

The window WIN may be disposed over the anti-reflection layer RPL. The window WIN may protect the display panel DP and the anti-reflection layer RPL from external scratches and shocks. The panel protection film PPF may be disposed under the display panel DP.

The first adhesive layer AL1 may be disposed between the display panel DP and the panel protection film PPF, and the display panel DP and the panel protection film PPF may be bonded to each other by the first adhesive layer AL1. The second adhesive layer AL2 may be disposed between the anti-reflection layer RPL and the display panel DP, and the anti-reflection layer RPL and the display panel DP may be bonded to each other by the second adhesive layer AL2. The third adhesive layer AL3 may be disposed between the window WIN and the anti-reflection layer RPL, and the window WIN and the anti-reflection layer RPL may be bonded to each other by the third adhesive layer AL3.

Figure 9:
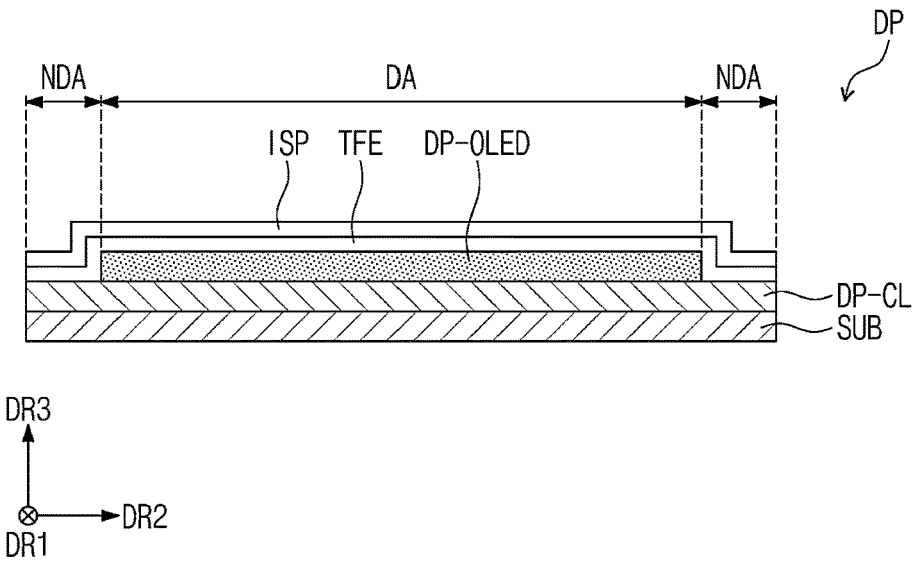
FIG. 9 is a sectional view of a display panel illustrated in FIG. 8.

FIG. 9 is a sectional view of the display panel illustrated in FIG. 8.

Referring to FIG. 9, an embodiment of the display panel DP may include a substrate SUB, a circuit element layer DP-CL disposed on the substrate SUB, a display element layer DP-OLED disposed on the circuit element layer DP-CL, a thin-film encapsulation layer TFE disposed on the display element layer DP-OLED, and an input sensing part ISP disposed on the thin-film encapsulation layer TFE. In an embodiment, the anti-reflection layer RPL described above with reference to FIG. 7 may not be disposed in the display panel DP in FIG. 9.

Figure 10:
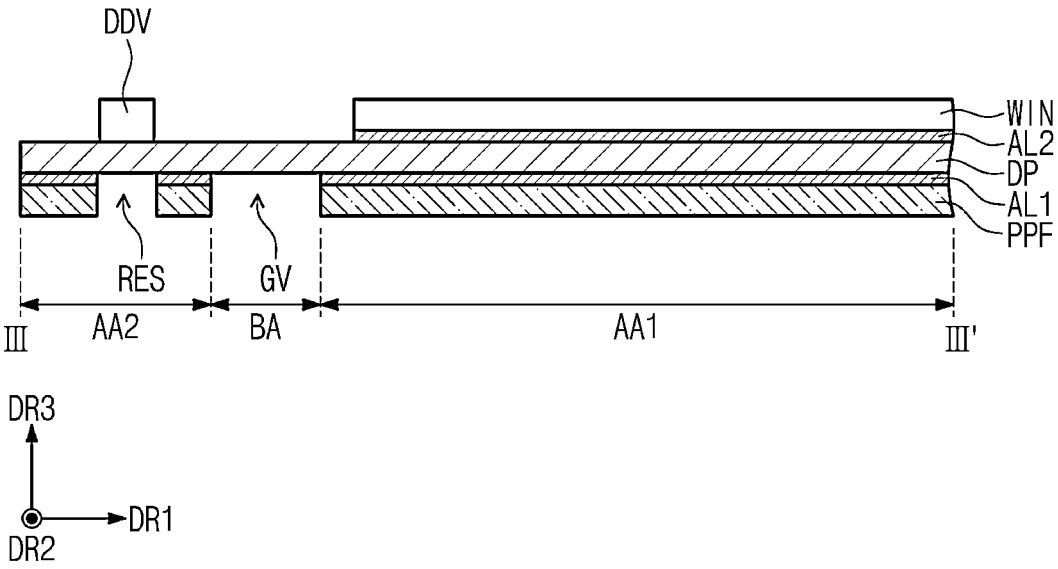
FIG. 10 is a sectional view taken along line III-III' illustrated in FIG. 5.
Figure 11:
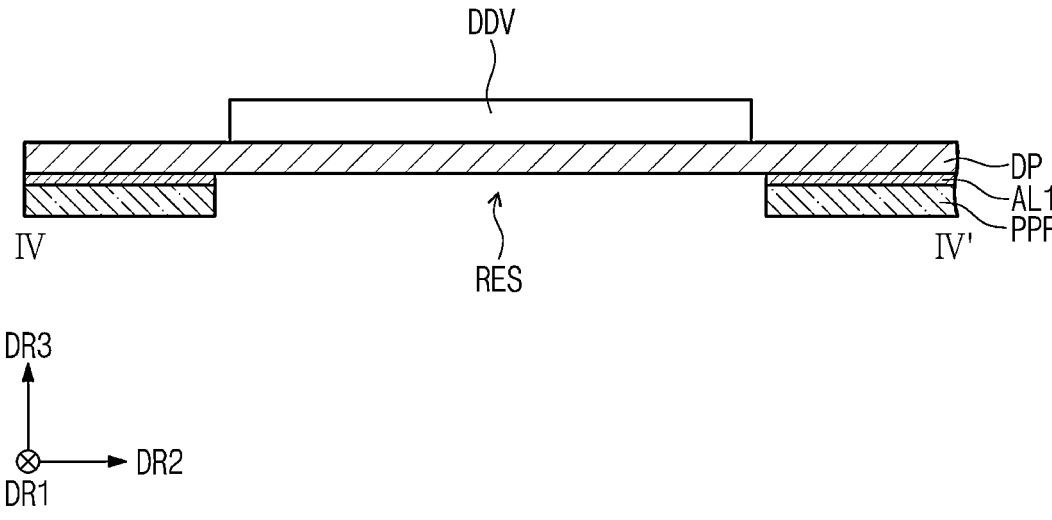
FIG. 11 is a sectional view taken along line IV-IV' illustrated in FIG. 5.
Figure 12:
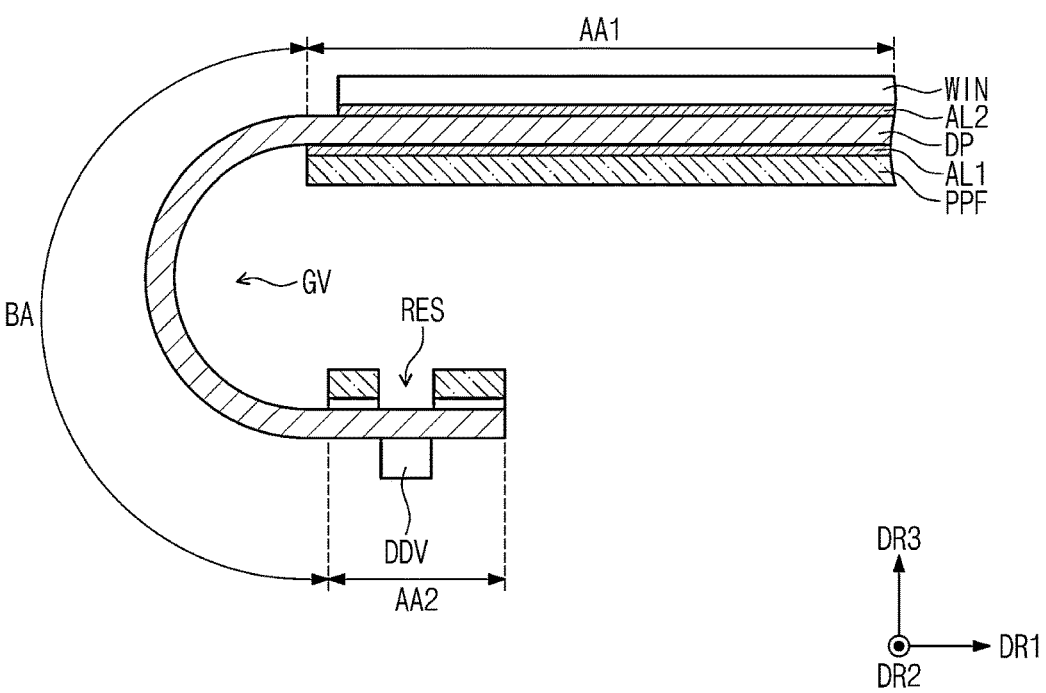
FIG. 12 is a view illustrating a state in which a bending area illustrated in FIG. 10 is bent.

FIG. 10 is a sectional view taken along line illustrated in FIG. 5. FIG. 11 is a sectional view taken along line IV-IV' illustrated in FIG. 5. FIG. 12 is a view illustrating a state in which the bending area illustrated in FIG. 10 is bent.

Referring to FIG. 10, in an embodiment, the window WIN may be disposed over the first area AA1. The second adhesive layer AL2 may be disposed on the first area AA1.

The panel protection film PPF and the firsts adhesive layer AL1 may be disposed under the display panel DP. The panel protection film PPF and the first adhesive layer AL1 may be disposed under the first and second areas AA1 and AA2 and may not be disposed under the bending area BA.

A groove GV overlapping the bending area BA when viewed on the plane may be defined in the panel protection film PPF. In an embodiment, for example, when viewed on the plane, the portion of the panel protection film PPF that overlaps the bending area BA and the portion of the first adhesive layer AL1 that overlaps the bending area BA may be removed to define the groove GV under the bending area BA. The groove GV may extend in the second direction DR2.

The panel protection film PPF and the first adhesive layer AL1 may be disposed under the second area AA2 not overlapping the data driver DDV. The panel protection film PPF and the first adhesive layer AL1 may not be disposed under the second area AA2 overlapping the data driver DDV.

Referring to FIGS. 10 and 11, a depression RES overlapping the data driver DDV when viewed on the plane may be defined in the panel protection film PPF. In an embodiment, for example, when viewed on the plane, the portion of the panel protection film PPF that overlaps the data driver DDV and the portion of the first adhesive layer AL1 that overlaps the data driver DDV may be removed to define the depression RES under the data driver DDV. A function of the depression RES will be described below in detail.

Referring to FIGS. 10 and 12, the bending area BA may be bent such that the second area AA2 is disposed under the first area AA1. Accordingly, the data driver DDV may be disposed under the first area AA1 and may not be exposed on the front side of the display panel DP.

The bending area BA may be bent so as to be convex toward the outside of the display panel DP. The bending area BA may be bent to have a predetermined curvature. The bending area BA may be effectively bent because the panel protection film PPF is not disposed under the bending area BA and the groove GV is defined under the bending area BA.

Figure 13:
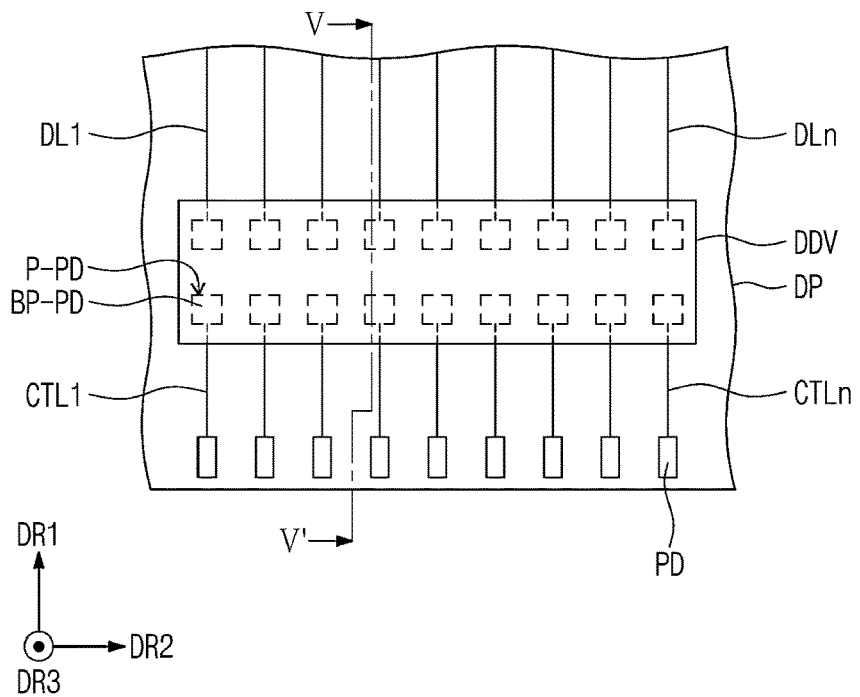
FIG. 13 is an enlarged view of a data driver illustrated in FIG. 5 and a portion of the display panel adjacent to the data driver.

FIG. 13 is an enlarged view of the data driver illustrated in FIG. 5 and a portion of the display panel adjacent to the data driver.

Figure 14:
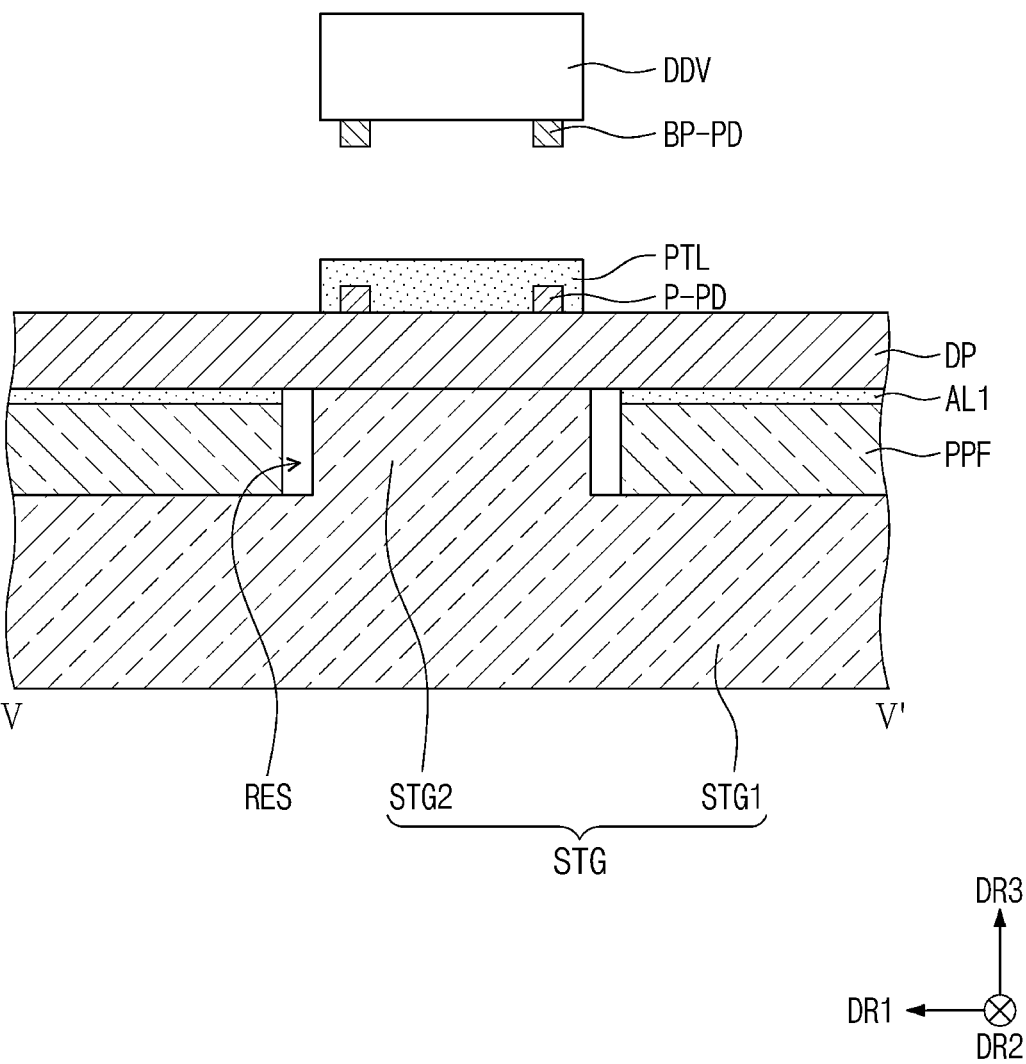
FIGS. 14 to 19 are views showing a bonding method using the bonding apparatus illustrated in FIG. 1.

Referring to FIG. 13, in an embodiment, a plurality of bump pads BP-PD and a plurality of panel pads P-PD may be disposed between the data driver DDV and the display panel DP. The bump pads BP-PD may be connected to the data driver DDV, and the panel pads P-PD may be connected to the display panel DP. The bump pads BP-PD may be connected to the panel pads P-PD, respectively. A section of this structure is illustrated in FIG. 14.

The data lines DL1 to DLn may extend in the first direction DR1 and may be connected to the panel pads P-PD. The data lines DL1 to DLn may be connected to the data driver DDV through the panel pads P-PD.

A plurality of connecting lines CTL1 to CTLn may be connected to the pads PD. The connecting lines CTL1 to CTLn may correspond to the data lines DL1 to DLn, respectively. The connecting lines CTL1 to CTLn may be connected to the panel pads P-PD. The connecting lines CTL1 to CTLn may be connected to the data driver DDV through the panel pads P-PD.

FIGS. 14 to 19 are views showing a bonding method using the bonding apparatus illustrated in FIG. 1.

FIGS. 14 to 19 show sectional views of the display panel taken along line V-V' illustrated in FIG. 13.

Referring to FIG. 14, the display panel DP may be disposed on the stage STG. The first stage STG1 may be disposed under the display panel DP. The second stage STG2 protruding from the first stage STG1 may be disposed in the depression RES defined in the panel protection film PPF.

The panel pads P-PD may be disposed on the display panel DP. The panel pads P-PD may be connected to the upper surface of the display panel DP. The panel pads P-PD may overlap the depression RES when viewed on the plane. The panel pads P-PD may include a metal. In an embodiment, for example, the panel pads P-PD may include titanium and aluminum.

The data driver DDV may be disposed over the display panel DP. The data driver DDV may overlap the depression RES when viewed on the plane. The data driver DDV may overlap the second stage STG2 when viewed on the plane.

The bump pads BP-PD may be disposed on the bottom of the data driver DDV. The bump pads BP-PD may be connected to a lower surface of the data driver DDV. The bump pads BP-PD may overlap the panel pads P-PD, respectively, when viewed on the plane. The bump pads BP-PD may include a metal. In an embodiment, for example, the bump pads BP-PD may include gold.

A protective layer PTL may be disposed between the data driver DDV and the display panel DP. The protective layer PTL may be disposed on the display panel DP and may cover the panel pads P-PD. The protective layer PTL may include a thermosetting resin.

Figure 15:
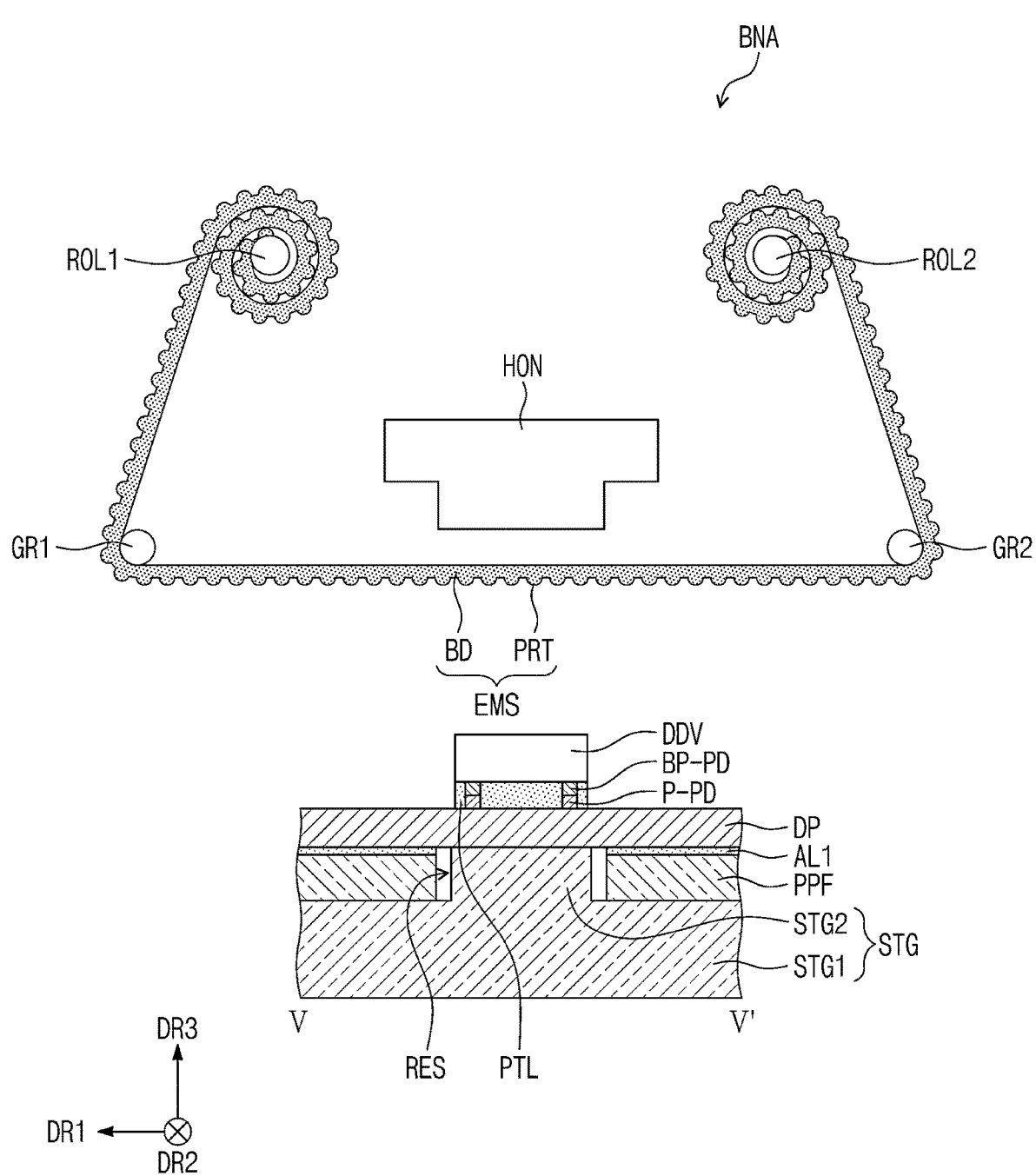

Referring to FIGS. 14 and 15, the data driver DDV may be moved downward to contact with the display panel DP. As the data driver DDV is moved downward, the bump pads BP-PD may make contact with the panel pads P-PD.

The protective layer PTL may cover the bump pads BP-PD and the panel pads P-PD. The protective layer PTL may be cured by heat generated from the ultrasonic oscillator HON in a subsequent bonding process to be performed later and may protect the bump-pads BP-PD and the panel pads P-PD. The protective layer PTL may block external moisture such that the external moisture does not infiltrate into the bump pads BP-PD and the panel pads P-PD.

The thermally cured protective layer PTL may fix the bump pads BP-PD and the panel pads P-PD to each other, such that the thermally cured protective layer PTL may fix the data driver DDV to the display panel DP.

Referring to FIG. 15, the first and second guide rollers GR1 and GR2 and the first and second rollers ROL1 and ROL2 may be disposed over the stage STG. The embossed sheet EMS may be disposed over the data driver DDV, and the ultrasonic oscillator HON may be disposed over the embossed sheet EMS.

The embossed sheet EMS may be guided by the first and second guide rollers GR1 and GR2 and may be disposed between the data driver DDV and the ultrasonic oscillator HON. The first and second guide rollers GR1 and GR2 and the first and second rollers ROL1 and ROL2 may rotate in a same direction, and a portion of the embossed sheet EMS that is to be used in the bonding process may be disposed under the ultrasonic oscillator HON.

Figure 16:
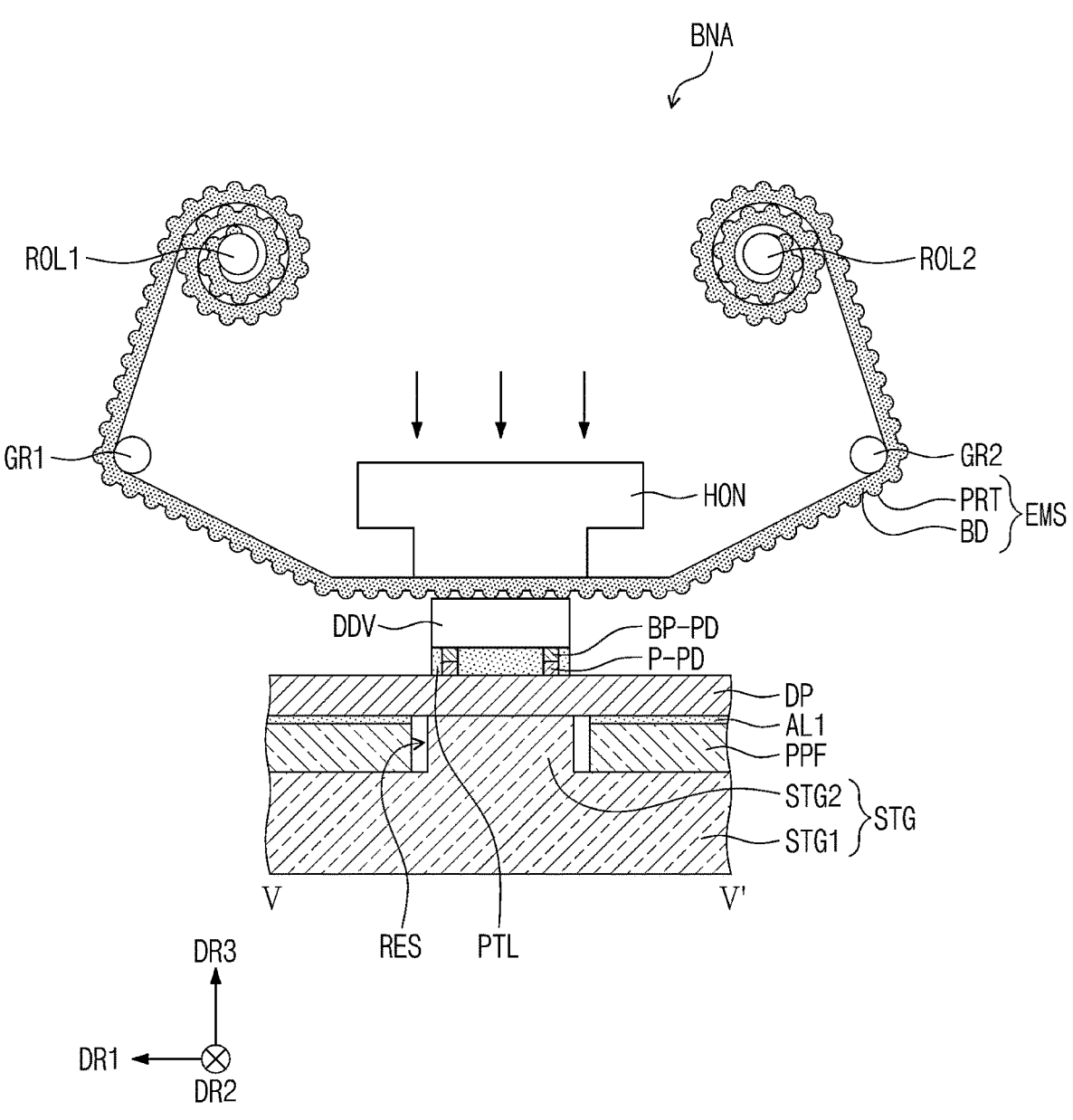

Referring to FIG. 16, the ultrasonic oscillator HON may move downward and may make contact with the upper surface of the embossed sheet EMS. The ultrasonic oscillator HON may move downward to bring the embossed sheet EMS into contact with the upper surface of the data driver DDV. The ultrasonic oscillator HON may make contact with the data driver DDV through the embossed sheet EMS. The ultrasonic oscillator HON may press the embossed sheet EMS to the data driver DDV, and the pressure by the ultrasonic oscillator HON may be applied to the data driver DDV through the embossed sheet EMS.

Figure 17:
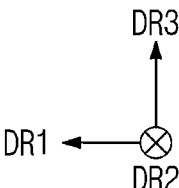

Referring to FIG. 17, the data driver DDV may be bonded and connected to the display panel DP by the ultrasonic oscillator HON. FIG. 17 illustrates an enlarged view of the ultrasonic oscillator HON, the data driver DDV, a portion of the embossed sheet EMS that is adjacent to the data driver DDV, a portion of the display panel DP that is adjacent to the data driver DDV, and a portion of the stage STG that is adjacent to the data driver DDV.

In the state of being pressed toward the data driver DDV, the ultrasonic oscillator HON may generate ultrasonic vibration oscillating in the first direction DR1 and heat. The data driver DDV may be bonded to the display panel DP by the heat and the ultrasonic vibration generated by the ultrasonic oscillator HON.

The bump pads BP-PD and the panel pads P-PD may be electrically connected with each other by the ultrasonic vibration and the heat. The ultrasonic vibration used in the bonding process will be described below in greater detail.

A solid may deform when an external force is applied to the solid. In the case where the magnitude of the external force is small, the solid may return to the original shape when the external force is removed. However, when the external force reaches a specific threshold value, the solid may permanently deform without returning to the original shape. The permanent deformation may be defined as plastic deformation.

As the external force increases, stress in the solid may also gradually increase. However, when the external force reaches the threshold value, permanent deformation may rapidly increase. The limit value (the aforementioned threshold value) of the stress may be defined as a yield value (a yield point).

Energy according to the ultrasonic vibration may be transferred to contact surfaces (or contact interfaces) between the bump pads BP-PD and the panel pads P-PD. The bump pads BP-PD and the panel pads P-PD may include a solid metal. The energy according to the ultrasonic vibration may be defined as an external force.

As the energy according to the ultrasonic vibration is transferred to the bump pads BP-PD and the panel pads P-PD, stresses of the bump pads BP-PD and the panel pads P-PD may increase. When the stresses reach a yield value, the bump pads BP-PD and the panel pads P-PD may plastically deform. Furthermore, oxidized layers on the contact surfaces (metal surfaces) of the bump pads BP-PD and the panel pads P-PD may be removed, and the bump pads BP-PD and the panel pads P-PD may make direct contact with each other.

Consistent friction and plastic deformation of the contact surfaces between the bump pads BP-PD and the panel pads P-PD may generate heat and may cause a temperature rise. In this case, atoms of the bump pads BP-PD and atoms of the panel pads P-PD may diffuse toward each other at the contact surfaces between the bump pads BP-PD and the panel pads P-PD making direct contact with each other.

In an embodiment, for example, the atoms of the contact surfaces of the bump pads BP-PD may diffuse toward the panel pads P-PD, and the atoms of the contact surfaces of the panel pads P-PD may diffuse toward the bump pads BP-PD. As a result, the bump pads BP-PD and the panel pads P-PD may be directly coupled or fused with each other.

The protective layer PTL may be cured by the heat generated from the ultrasonic oscillator HON. As described above, the cured protective layer PTL may protect and fix the bump pads BP-PD and the panel pads P-PD connected with each other.

In a case where the embossed sheet EMS includes a plastic material, the heat may not be easily transferred to the bump pads BP-PD and the protective layer PTL. Furthermore, the plastic material having flexible characteristics may not be able to easily transmit the ultrasonic vibration to the bump pads BP-PD. Accordingly, in an embodiment, the embossed sheet EMS may include a metallic material.

In a case where the ultrasonic oscillator HON makes direct contact with the upper surface of the data driver DDV without disposing the embossed sheet EMS therebetween, the upper surface of the data driver DDV may be damaged. In a case, for example, the ultrasonic oscillator HON having a flat lower surface may make contact with the data driver DDV, and therefore the contact area between the ultrasonic oscillator HON and the data driver DDV may be increased. In this case, when vibration occurs in the state in which the ultrasonic oscillator HON makes contact with foreign matter existing on the upper surface of the data driver DDV, the upper surface of the data driver DDV may be scratched by the foreign matter.

In an embodiment of the disclosure, the protrusions PRT having a convex curved surface of the embossed sheet EMS may make contact with the upper surface of the data driver DDV, and thus the contact area for the upper surface of the data driver DDV may be minimized. Accordingly, damage to the upper surface of the data driver DDV may be effectively prevented. In such an embodiment, the protrusions PRT may be densely disposed as described above with reference to FIG. 2, and thus the ultrasonic vibration may be effectively transmitted to the data driver DDV.

In a case where the depression RES is not formed and the first adhesive layer AL1 is disposed under the data driver DDV, the data driver DDV may not be easily supported by the first adhesive layer AL1 having fluidity. In this case, the transmission force of the ultrasonic vibration may be reduced by the first adhesive layer AL1 having fluidity.

In an embodiment, as described above, the depression RES is defined by removing the first adhesive layer AL1 disposed under the data driver DDV and the second stage STG2 is disposed in the depression RES, such that the data driver DDV may be effectively supported by the stage STG.

With respect to a direction (e.g., the third direction DR3) perpendicular to the upper surface of the body BD, a first thickness TH1 of each of the protrusions PRT may be smaller than a second thickness TH2 of the body BD and may be greater than half the second thickness TH2. In a case where the protrusions PRT are thicker than the body BD, the support force of the body BD for the protrusions PRT may be weakened. Accordingly, in an embodiment of the disclosure, the first thickness TH1 of each of the protrusions PRT may be set to be smaller than the second thickness TH2 and greater than half the second thickness TH2.

In a case where the protrusions PRT are directly attached to the lower surface of the ultrasonic oscillator HON and the bonding process is performed, the adhesion of the protrusions PRT to the lower surface of the ultrasonic oscillator HON may be decreased by the ultrasonic vibration. Therefore, the protrusions PRT may not be aligned with one another, or may be separated from the ultrasonic oscillator HON.

In an embodiment of the disclosure, the protrusions PRT may protrude downward from the body BD, and the body BD may make contact with the lower surface of the ultrasonic oscillator HON. Accordingly, the protrusion PRT may not be directly attached to the lower surface of the ultrasonic oscillator HON. In such an embodiment, the protrusions PRT may protrude downward from the body BD, and the body BD may serve to support the protrusions PRT. In such an embodiment, the body BD may entirely make contact with the lower surface of the ultrasonic oscillator HON, and thus the ultrasonic vibration may be effectively transmitted to the protrusions PRT.

In an embodiment, the embossed sheet EMS may include a metal. However, the embossed sheet EMS may not include specific metal. In an embodiment, for example, the embossed sheet EMS may not include aluminum, gold, and platinum.

The data driver DDV may include silicon. In the bonding process, the bondability of silicon to aluminum, gold, and platinum may be higher than those of other metals. In a case where the embossed sheet EMS includes aluminum, gold, and platinum, the embossed sheet EMS may be bonded to the data driver DDV by the ultrasonic vibration. To prevent such a phenomenon, the embossed sheet EMS may include metal other than aluminum, gold, and platinum.

Figure 18A:
Figure 18B:
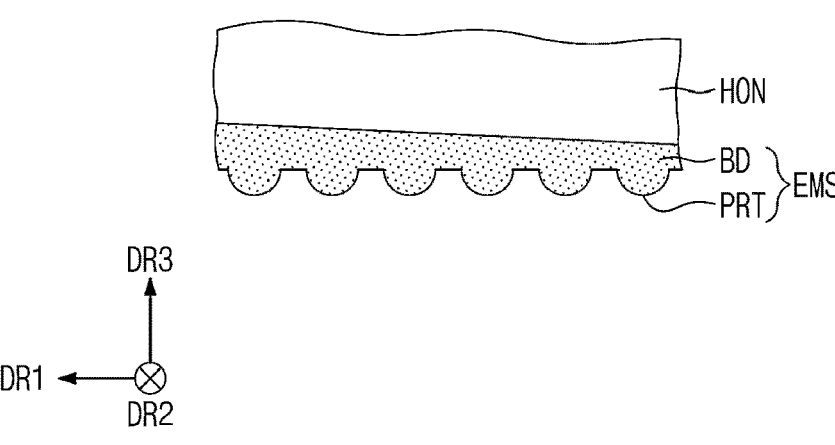

FIGS. 18A and 18B are views for explaining an operation of improving the flatness of the ultrasonic oscillator by the embossed sheet in FIG. 17.

Referring to FIGS. 18A and 18B, the ultrasonic oscillator HON may be disposed to be inclined with respect to the first direction DR1. In a case where the inclined ultrasonic oscillator HON makes direct contact with the data driver DDV and a bonding operation is performed, the bump pads BP-PD and the panel pads P-PD may not be uniformly bonded with each other, and therefore the bonding quality may be deteriorated.

Specifically, in a case where the embossed sheet EMS is not used, the inclined ultrasonic oscillator HON may make direct contact with the upper surface of the data driver DDV. In this case, as the ultrasonic oscillator HON is inclined, the right side of the ultrasonic oscillator HON in FIG. 18B may make contact with the upper surface of the data driver DDV, and the left side of the ultrasonic oscillator HON may not make contact with the upper surface of the data driver DDV. In this case, the bump pads BP-PD disposed on the right side of the data driver DDV may be bonded to the panel pads P-PD. However, the bump pads BP-PD disposed on the left side of the data driver DDV may not be bonded to the panel pads P-PD. That is, the bonding uniformity may be lowered.

Although the ultrasonic oscillator HON inclined with respect to the first direction DR1 is illustrated, the ultrasonic oscillator HON may be disposed to be inclined with respect to the second direction DR2.

In an embodiment, the ultrasonic oscillator HON inclined with respect to the first direction DR1 may move downward and may make contact with the embossed sheet EMS. In such an embodiment, the embossed sheet EMS may serve as a cushion. In an embodiment, for example, flexible metal may have a predetermined elasticity and may serve as a buffer.

The upper surface of the embossed sheet EMS may also be inclined by the inclined ultrasonic oscillator HON. However, due to the cushion function of the embossed sheet EMS, the lower portion of the embossed sheet EMS may remain horizontal even when the ultrasonic oscillator HON is disposed to be inclined. Accordingly, the flatness of the ultrasonic oscillator HON may be improved by the embossed sheet EMS.

A bonding operation by the ultrasonic oscillator HON may be performed by the horizontally-disposed lower portion of the embossed sheet EMS. Accordingly, in the bonding operation, pressure may be uniformly transmitted to the bump pads BP-PD and the panel pads P-PD. As a result, the bump pads BP-PD and the panel pads P-PD may be uniformly bonded with each other, and thus the bonding quality may be improved.

In an embodiment of the disclosure, bonding uniformity for the bump pads BP-PD and the panel pads P-PD may be improved as the flatness of the ultrasonic oscillator HON is improved by the embossed sheet EMS.

Figure 19:
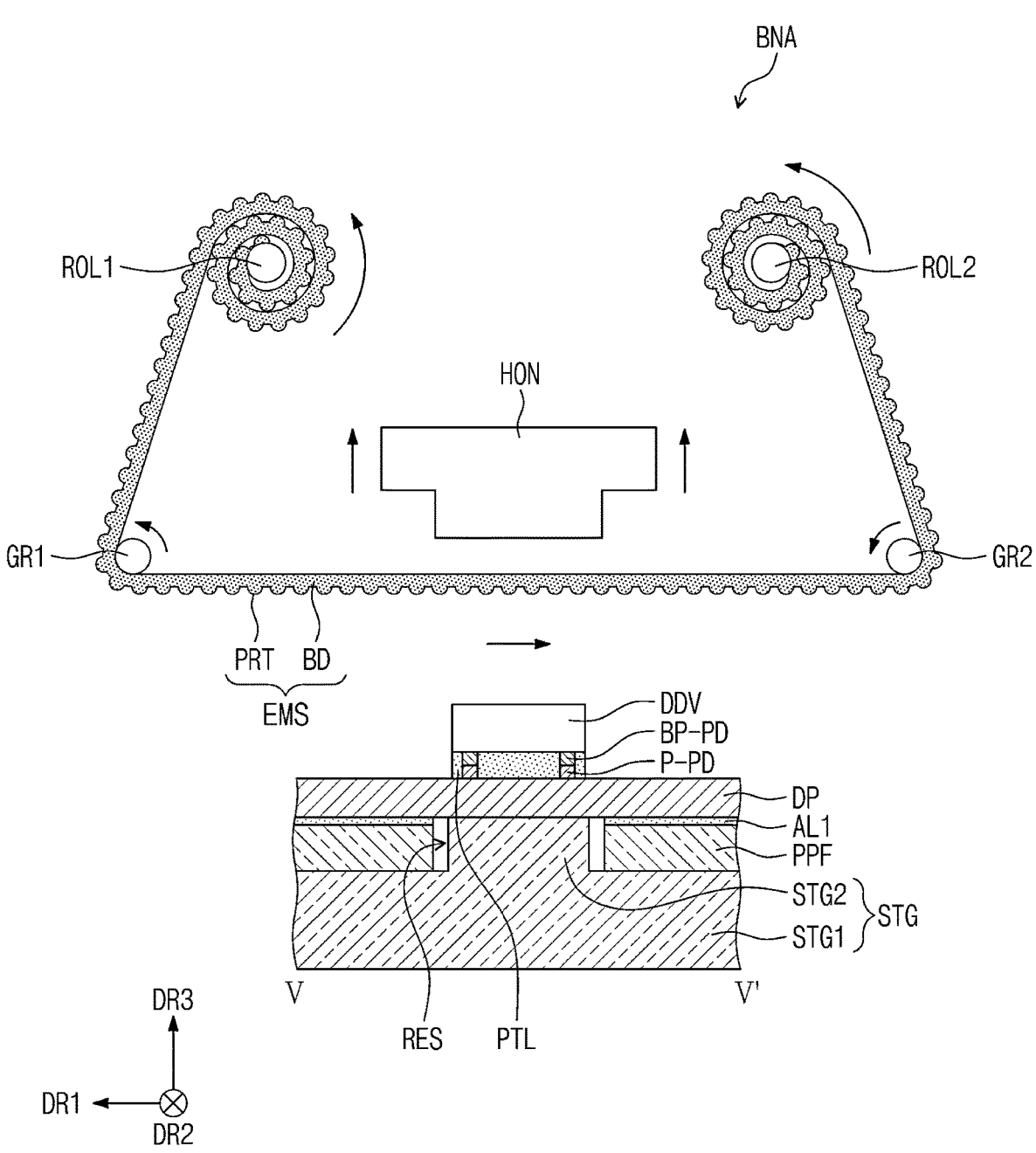

Referring to FIG. 19, the ultrasonic oscillator HON may move upward after the bonding process is completed. The embossed sheet EMS may be spaced apart upward from the data driver DDV. The first and second rollers ROL1 and ROL2 and the first and second guide rollers GR1 and GR2 may rotate in a same direction and may move the embossed sheet EMS in the first direction DR1.

In an embodiment, for example, to move the embossed sheet EMS in the first direction DR1, the first and second rollers ROL1 and ROL2 and the first and second guide rollers GR1 and GR2 may rotate in the counterclockwise direction. Alternatively, without being limited thereto, the first and second rollers ROL1 and ROL2 and the first and second guide rollers GR1 and GR2 may rotate in the clockwise direction.

As the first and second rollers ROL1 and ROL2 and the first and second guide rollers GR1 and GR2 rotate, the embossed sheet EMS used for the bonding process may move outside the ultrasonic oscillator HON, and a new portion of the embossed sheet EMS may be disposed under the ultrasonic oscillator HON. Because the new portion of the embossed sheet EMS is provided under the ultrasonic oscillator HON as the first and second rollers ROL1 and ROL2 and the first and second guide rollers GR1 and GR2 rotate, a property of the embossed sheet EMS used in the bonding process may be constantly maintained.

Figure 20:
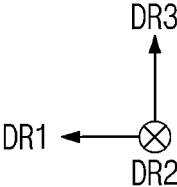
FIG. 20 is a view illustrating a configuration of an embossed sheet according to an embodiment of the disclosure.

FIG. 20 is a view illustrating a configuration of an embossed sheet according to an embodiment of the disclosure.

Referring to FIG. 20, a resin RIN may be disposed between the embossed sheet EMS and the data driver DDV. The resin RIN may include a thermosetting resin. The embossed sheet EMS may be attached to the upper surface of the data driver DDV by the resin RIN. The embossed sheet EMS may be cut to have a diameter corresponding to the diameter of the data driver DDV and may be attached to the data driver DDV.

A bonding process may be performed in the state in which the embossed sheet EMS is attached to the data driver DDV by the resin RIN. In an embodiment, for example, the embossed sheet EMS may be attached to the upper surface of the data driver DDV by the resin RIN when the data driver DDV is manufactured.

In such an embodiment, when the bonding process is performed by the ultrasonic oscillator HON, the resin RIN may be cured. As the resin RIN having high fluidity is attached to the bottom of the embossed sheet EMS, the cushion function of the embossed sheet EMS may be further improved. In such an embodiment, the flatness of the inclined ultrasonic oscillator HON may be further improved by the resin RIN and the cushion function of the embossed sheet EMS.

According to embodiments of the disclosure, the embossed sheet having an embossing structure may be disposed between the ultrasonic oscillator and the data driver, and the ultrasonic oscillator may make contact with the data driver through the embossed sheet and may bond the data driver to the display panel. In such embodiments, the flatness of the ultrasonic oscillator making contact with the data driver may be improved by the cushion function of the embossed sheet, and thus the bonding quality may be improved. In such embodiments, damage to the upper surface of the data driver may be effectively prevented because the ultrasonic oscillator does not make direct contact with the data driver.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit and scope of the invention as defined by the following claims.

What is claimed is:

1. A bonding apparatus comprising:
an ultrasonic oscillator which generates ultrasonic vibration;
a stage disposed under the ultrasonic oscillator; and
an embossed sheet disposed between the ultrasonic oscillator and the stage,
wherein the embossed sheet includes:
a body; and a plurality of protrusions protruding downward from a lower surface of the body which faces the stage, wherein the protrusions extend in a direction crossing an oscillating direction of an ultrasonic vibration of the ultrasonic oscillator,
wherein the ultrasonic oscillator moves toward the stage, and the embossed sheet moves toward the stage by the ultrasonic oscillator to perform a bonding process, and the embossed sheet moves away from the stage after the bonding process is completed.

2. The bonding apparatus of claim 1, wherein each of the protrusions has a curved surface convex downward.

3. The bonding apparatus of claim 1, wherein a gap between a $k^{th}$ protrusion and a $(k+1)^{th}$ protrusion among the protrusions is smaller than a diameter of each of the protrusions, wherein k is a natural number.

4. The bonding apparatus of claim 1, wherein each of the protrusions has a dot shape when viewed on a plane.

5. The bonding apparatus of claim 1, wherein with respect to a direction perpendicular to an upper surface of the body, a first thickness of each of the protrusions is smaller than a second thickness of the body and greater than half the second thickness.

6. The bonding apparatus of claim 1, further comprising:
a first guide roller and a second guide roller which are spaced apart from each other in a first direction with the ultrasonic oscillator therebetween; and
a first roller and a second roller which are disposed over the first guide roller and the second guide roller, respectively, and spaced apart from each other in the first direction,
wherein the ultrasonic oscillator generates the ultrasonic vibration in the first direction, and
wherein the embossed sheet extends in the first direction and is rolled around the first and second rollers and guided by the first and second guide rollers to be located under the ultrasonic oscillator.

7. The bonding apparatus of claim 6, wherein the first and second rollers and the first and second guide rollers rotate in a same direction to move the embossed sheet.

8. The bonding apparatus of claim 1, wherein
a display panel is disposed on the stage,
the embossed sheet is disposed over a data driver disposed on the display panel, and
the ultrasonic oscillator moves downward and makes contact with the data driver through the embossed sheet.

9. The bonding apparatus of claim 8, wherein the embossed sheet includes a metal.

10. The bonding apparatus of claim 9, wherein
the data driver includes silicon, and
the embossed sheet includes a metal other than aluminum, gold, and platinum.

11. The bonding apparatus of claim 8, wherein the stage includes:
a first stage disposed under the display panel; and
a second stage protruding upward from the first stage,
wherein the second stage is disposed in a depression defined in a panel protection film under the display panel.

12. The bonding apparatus of claim 11, wherein the depression, when viewed on a plane, overlaps the data driver.

13. The bonding apparatus of claim 1, wherein
the ultrasonic oscillator generates the ultrasonic vibration in a first direction, and the protrusions extend in a second direction crossing the first direction and are arranged in the first direction.

14. The bonding apparatus of claim 1, further comprising: a resin disposed between the embossed sheet and a data driver disposed under the embossed sheet.

15. The bonding apparatus of claim 14, wherein the embossed sheet is attached to an upper surface of the data driver by the resin.

16. The bonding apparatus of claim 14, wherein the resin includes a thermosetting resin.

17. A bonding method comprising:

disposing a data driver on a display panel disposed on a stage;

disposing an embossed sheet over the data driver and an ultrasonic oscillator over the embossed sheet;

bringing the ultrasonic oscillator into contact with the data driver through the embossed sheet by moving the ultrasonic oscillator downward to the data driver; and bonding the data driver to the display panel by generating ultrasonic vibration and heat from the ultrasonic oscillator, wherein the embossed sheet includes:

a body; and a plurality of protrusions protruding downward from a lower surface of the body which faces the stage.

18. The bonding method of claim 17, wherein each of the protrusions has a curved surface convex downward, and a gap between a $k^{th}$ protrusion and a $(k+1)^{th}$ protrusion among the protrusions is smaller than a diameter of each of the protrusions, wherein k is a natural number.

19. The bonding method of claim 17, wherein the data driver includes silicon, and the embossed sheet includes a metal other than aluminum, gold, and platinum.

20. The bonding method of claim 17, wherein a resin is disposed between the embossed sheet and the data driver, and the embossed sheet is attached to an upper surface of the data driver by the resin.

\* \* \* \* \*